(12) United States Patent
Barth, Jr. et al.

(10) Patent No.: US 9,564,443 B2
(45) Date of Patent: Feb. 7, 2017

(54) DYNAMIC RANDOM ACCESS MEMORY CELL WITH SELF-ALIGNED STRAP

(71) Applicant: International Business Machines Corporation, Armonk, NY (US)

(72) Inventors: John E. Barth, Jr., Williston, VT (US); Kangguo Cheng, Schenectady, NY (US); Herbert L. Ho, New Windsor, NY (US); Ali Khakifirooz, Mountain View, CA (US); Ravikumar Ramachandran, Pleasantville, NY (US); Kern Rim, Yorktown Heights, NY (US); Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/158,956

(22) Filed: Jan. 20, 2014

(65) Prior Publication Data
US 2015/0206884 A1    Jul. 23, 2015

(51) Int. Cl.
*H01L 27/108* (2006.01)
*H01L 29/417* (2006.01)
*H01L 29/66* (2006.01)

(52) U.S. Cl.
CPC ..... *H01L 27/10867* (2013.01); *H01L 27/1087* (2013.01); *H01L 27/10826* (2013.01);
(Continued)

(58) Field of Classification Search
CPC .............. H01L 2924/0002; H01L 2924/00; H01L 25/0753; H01L 33/48; H01L 33/64; H01L 21/02263; H01L 21/31144; H01L 27/10826; H01L 27/10829; H01L 27/1087; H01L 27/10879; H01L 29/0653; H01L 29/41783; H01L 29/41791; H01L 21/31155; H01L 29/66181; H01L 29/6653; H01L 29/6656; H01L 27/10867

See application file for complete search history.

(56) References Cited

U.S. PATENT DOCUMENTS

| | | |
|---|---|---|
| 7,157,768 B2 | 1/2007 | Hofmann et al. |
| 7,419,859 B2 | 9/2008 | Kim et al. |

(Continued)

OTHER PUBLICATIONS

Office Action dated Oct. 6, 2016 received in U.S. Appl. No. 14/874,390.

*Primary Examiner* — A. Sefer
*Assistant Examiner* — Benjamin Tzu-Hung Liu
(74) *Attorney, Agent, or Firm* — Scully, Scott, Murphy & Presser, P.C.; Steven J. Meyers

(57) ABSTRACT

After formation of trench capacitors and source and drain regions and gate structures for access transistors, a dielectric spacer is formed on a first sidewall of each source region, while a second sidewall of each source region and sidewalls of drain regions are physically exposed. Each dielectric spacer can be employed as an etch mask during removal of trench top dielectric portions to form strap cavities for forming strap structures. Optionally, selective deposition of a semiconductor material can be performed to form raised source and drain regions. In this case, the raised source regions grow only from the first sidewalls and do not grow from the second sidewalls. The raised source regions can be employed as a part of an etch mask during formation of the strap cavities. The strap structures are formed as self-aligned structures that are electrically isolated from adjacent access transistors by the dielectric spacers.

13 Claims, 39 Drawing Sheets

(52) U.S. Cl.
CPC .. *H01L 27/10829* (2013.01); *H01L 27/10879* (2013.01); *H01L 29/41783* (2013.01); *H01L 29/41791* (2013.01); *H01L 29/6653* (2013.01); *H01L 29/6656* (2013.01); *H01L 29/66181* (2013.01)

(56) References Cited

U.S. PATENT DOCUMENTS

| | | |
|---|---|---|
| 7,518,181 B2 | 4/2009 | Park et al. |
| 8,174,058 B2 | 5/2012 | Marshall et al. |
| 8,227,867 B2 * | 7/2012 | Anderson ......... H01L 29/66795 257/349 |
| 2005/0145913 A1 * | 7/2005 | Katsumata .......... H01L 27/1087 257/301 |
| 2006/0105536 A1 * | 5/2006 | Cheng ............ H01L 21/823807 438/386 |
| 2007/0026615 A1 * | 2/2007 | Goktepeli ............ H01L 29/785 438/281 |
| 2007/0048934 A1 | 3/2007 | Kim et al. |
| 2007/0176253 A1 * | 8/2007 | Wang ................ H01L 27/10876 257/506 |
| 2007/0222036 A1 | 9/2007 | Park et al. |
| 2007/0284632 A1 | 12/2007 | Kim et al. |
| 2009/0137093 A1 * | 5/2009 | Lin .................. H01L 27/10876 438/421 |
| 2009/0256185 A1 * | 10/2009 | Cheng .................... H01L 21/84 257/301 |
| 2011/0084216 A1 | 4/2011 | Hautala |
| 2011/0248326 A1 * | 10/2011 | Kanakasabapathy . H01L 21/845 257/300 |
| 2012/0256238 A1 | 10/2012 | Ning |

* cited by examiner

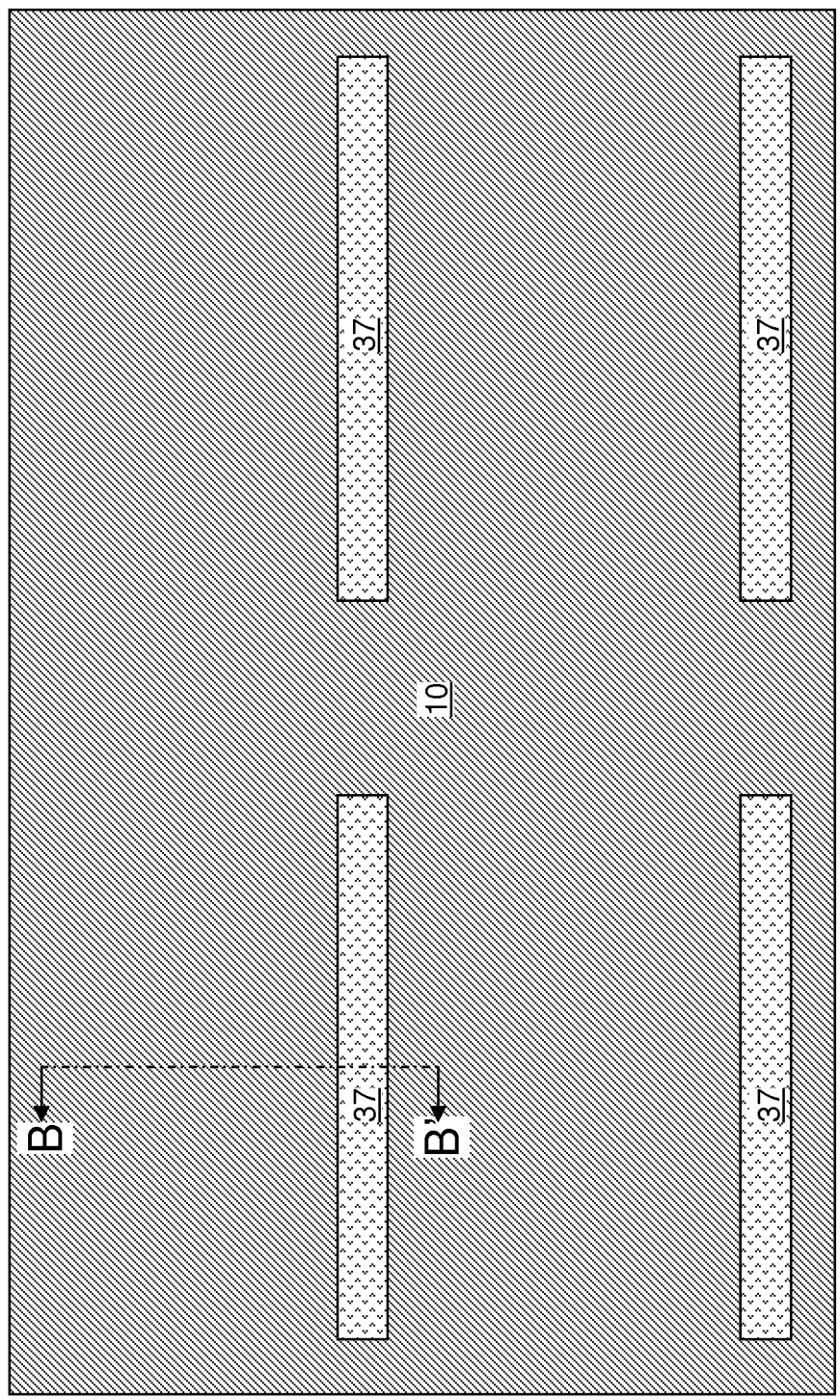

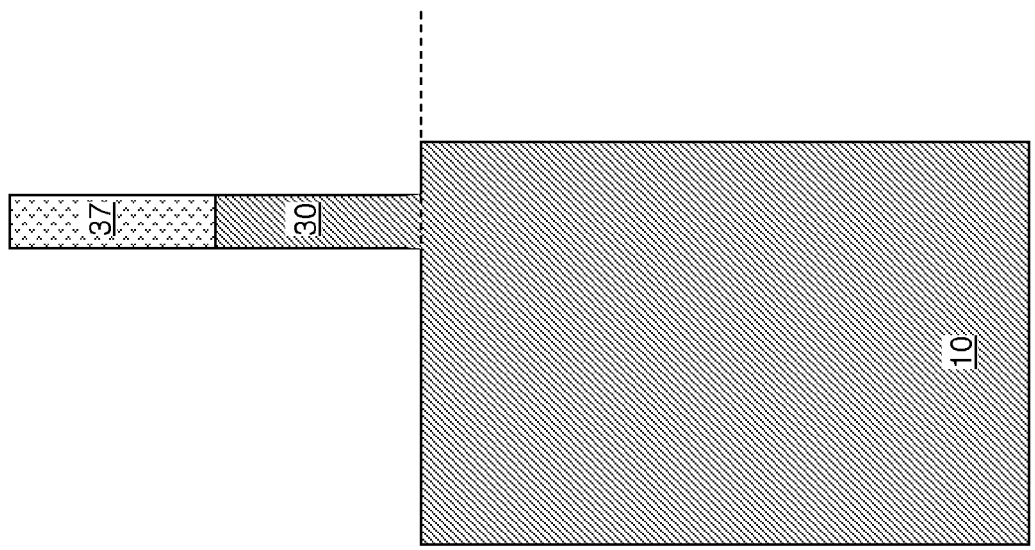

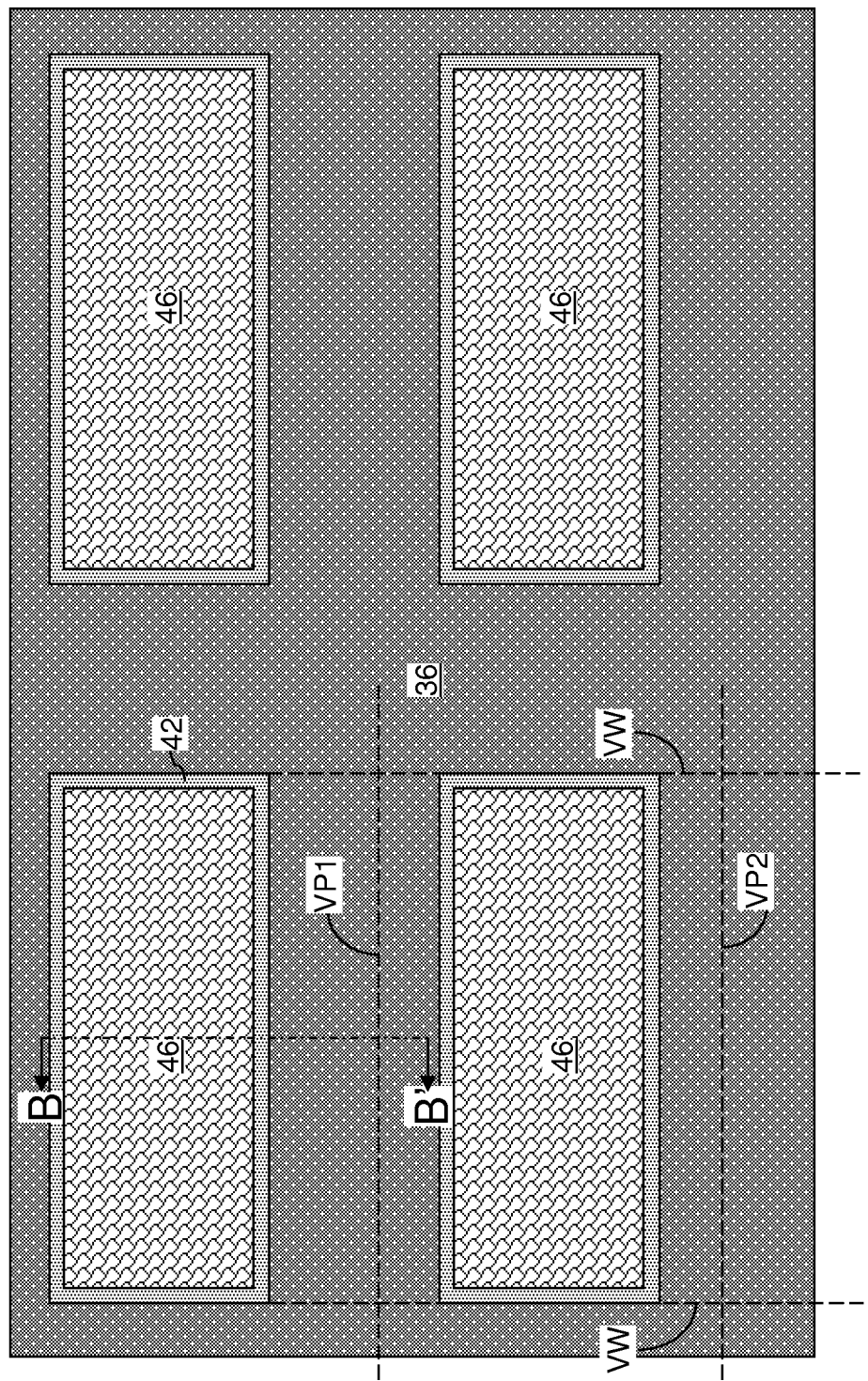

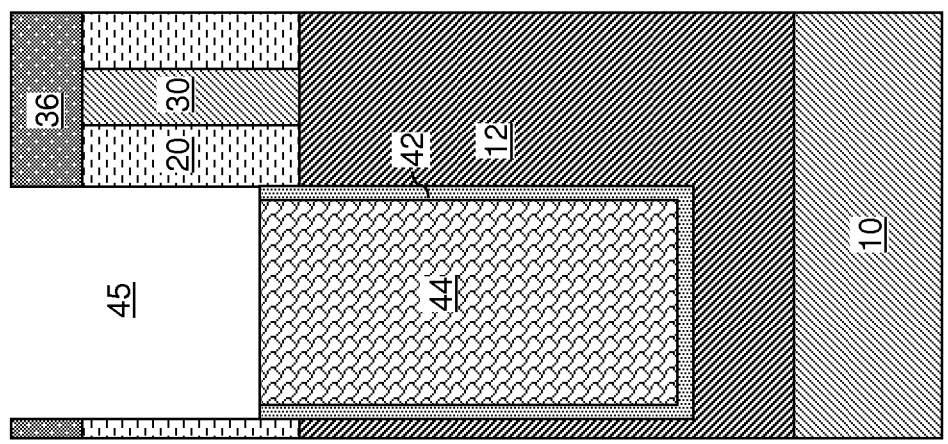

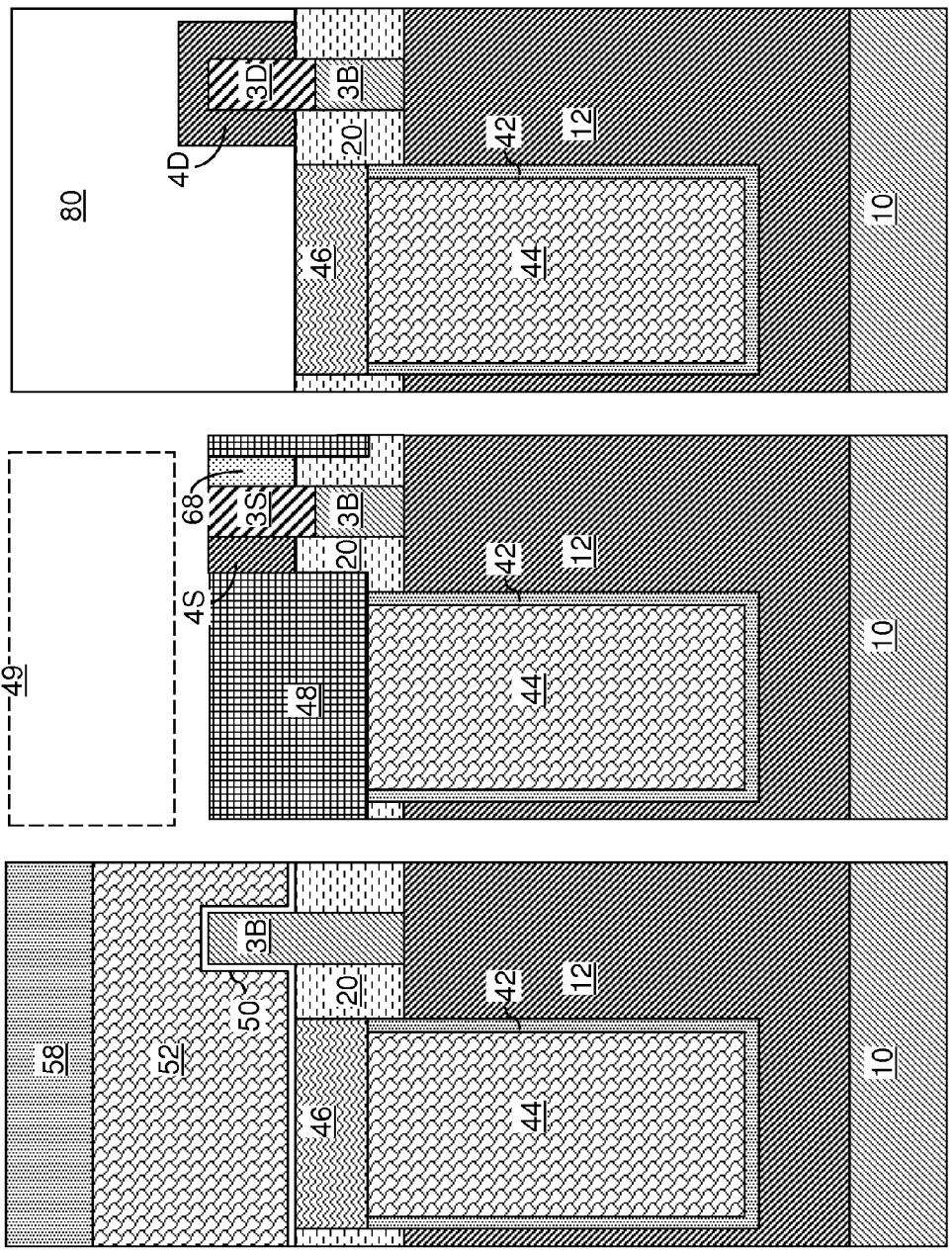

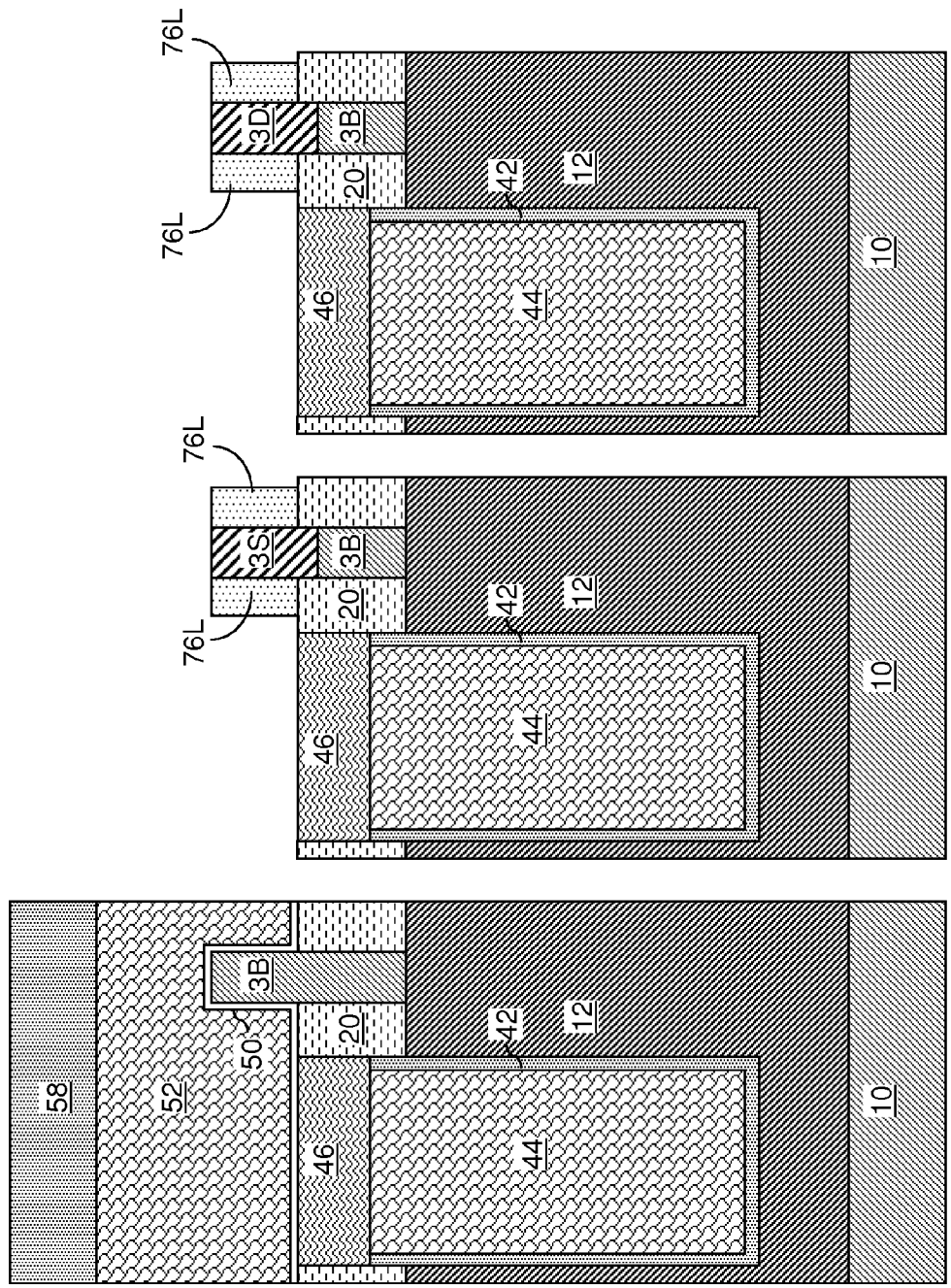

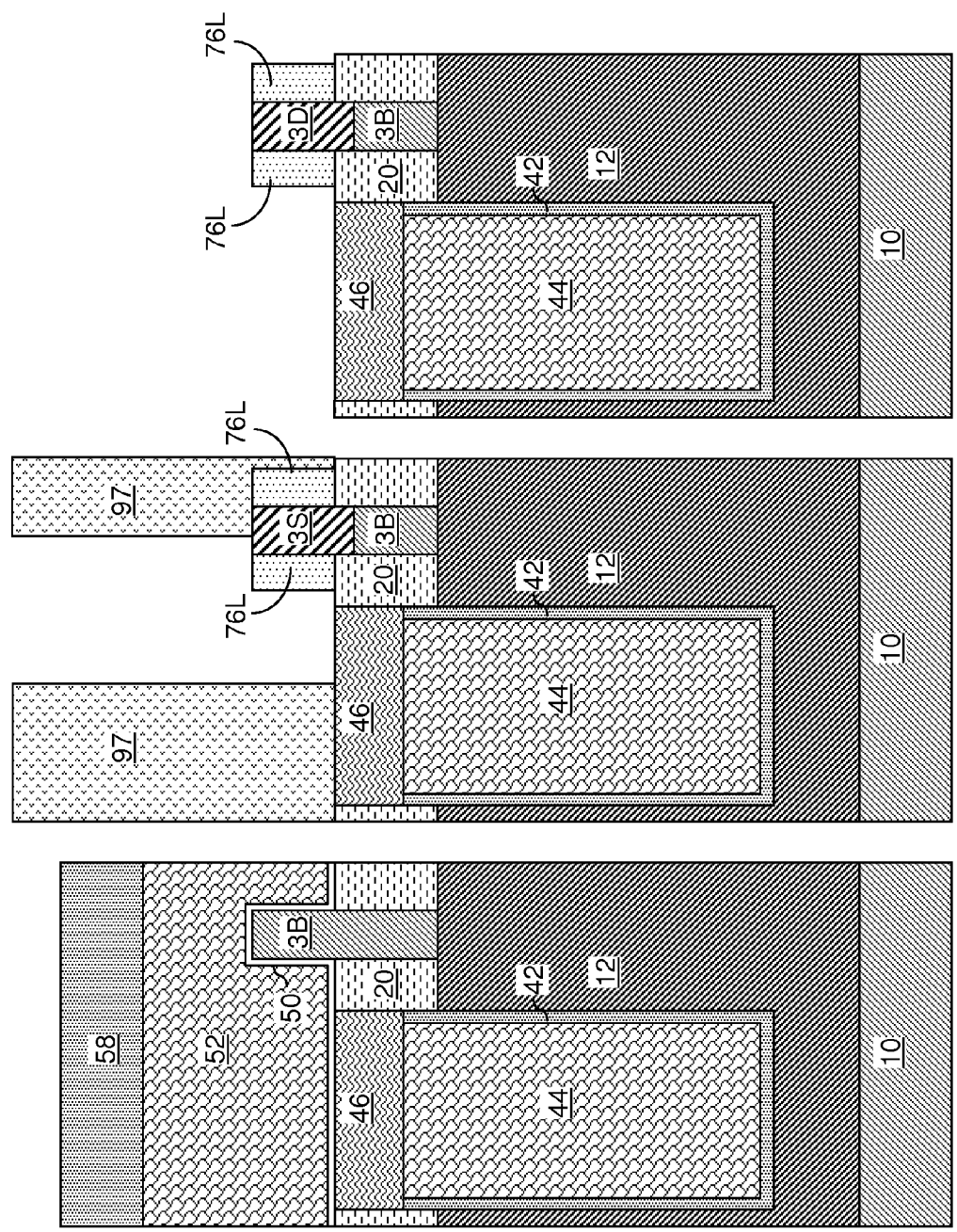

DYNAMIC RANDOM ACCESS MEMORY CELL WITH SELF-ALIGNED STRAP

BACKGROUND

The present disclosure relates to a semiconductor structure, and particularly to a dynamic random access memory (DRAM) cell including a finFET access transistor and a method of manufacturing the same.

Trench capacitors are used in a variety of semiconductor chips for high areal capacitance and low device leakage. Typically, a trench capacitor provides a capacitance in the range from 4 fF (femto-Farad) to 120 fF. A trench capacitor may be employed as a charge storage unit in a dynamic random access memory (DRAM), which may be provided as a stand-alone semiconductor chip, or may be embedded in a system-on-chip (SoC) semiconductor chip. A trench capacitor may also be employed in a variety of circuit applications such as a charge pump or a capacitive analog component in a radio-frequency (RF) circuit.

The inner electrode of each trench capacitor needs to be electrically connected to a source region of an access transistor. Electrical isolation of each conductive strap providing an electrical path between the inner electrode of a trench capacitor and an access transistor is difficult because misalignment of the conductive strap can cause electrical shorts between the inner electrode and neighboring conductive components of semiconductor devices.

SUMMARY

After formation of trench capacitors and source and drain regions and gate structures for access transistors, a dielectric spacer is formed on a first sidewall of each source region, while a second sidewall of each source region and sidewalls of drain regions are physically exposed. Each dielectric spacer can be employed as an etch mask during removal of trench top dielectric portions to form strap cavities for forming strap structures. Optionally, selective deposition of a semiconductor material can be performed to form raised source and drain regions. In this case, the raised source regions grow only from the first sidewalls and do not grow from the second sidewalls. The raised source regions can be employed as a part of an etch mask during formation of the strap cavities. The strap structures are formed as self-aligned structures that are electrically isolated from adjacent access transistors by the dielectric spacers.

According to an aspect of the present disclosure, a semiconductor structure includes a semiconductor fin located on a substrate and including a source region therein. A dielectric material portion contacts a first sidewall of the source region. A raised source region contacts a second sidewall of the source region. The semiconductor structure further includes a trench capacitor located within the substrate, and a conductive strap structure contacting an inner electrode of the trench capacitor and the raised source region.

According to another aspect of the present disclosure, a method of forming a semiconductor structure is provided. A trench capacitor is formed in a substrate. A semiconductor fin including a source region and a drain region is formed on the substrate. A dielectric material portion contacts a first sidewall of the source region. A second sidewall of the source region is physically exposed after formation of the dielectric material portion. A raised source region is formed on the second sidewall of the source region. A conductive strap structure is formed on an inner electrode of the trench capacitor and on a sidewall of the raised source region.

BRIEF DESCRIPTION OF SEVERAL VIEWS OF THE DRAWINGS

FIG. 2A is a top-down view of the first exemplary semiconductor structure after formation of semiconductor fins according to the first embodiment of the present disclosure.

FIG. 2B is a vertical cross-sectional view of the first exemplary semiconductor structure along the vertical plane B-B' of FIG. 2A.

FIG. 5A is a top-down view of the first exemplary semiconductor structure after formation of trench capacitors according to the first embodiment of the present disclosure.

FIG. 5B is a vertical cross-sectional view of the first exemplary semiconductor structure along the vertical plane B-B' of FIG. 5A.

FIG. 14B is a vertical cross-sectional view of the first exemplary semiconductor structure along the vertical plane B-B' of FIG. 14A.

FIG. 14C is a vertical cross-sectional view of the first exemplary semiconductor structure along the vertical plane C-C' of FIG. 14A.

FIG. 14D is a vertical cross-sectional view of the first exemplary semiconductor structure along the vertical plane D-D' of FIG. 14A.

FIG. 16B is a vertical cross-sectional view of the variation of the second exemplary semiconductor structure along the vertical plane B-B' of FIG. 16A.

FIG. 16C is a vertical cross-sectional view of the variation of the second exemplary semiconductor structure along the vertical plane C-C' of FIG. 16A.

FIG. 16D is a vertical cross-sectional view of the variation of the second exemplary semiconductor structure along the vertical plane D-D' of FIG. 16A.

FIG. 17B is a vertical cross-sectional view of the variation of the second exemplary semiconductor structure along the vertical plane B-B' of FIG. 17A.

FIG. 17C is a vertical cross-sectional view of the variation of the second exemplary semiconductor structure along the vertical plane C-C' of FIG. 17A.

FIG. 17D is a vertical cross-sectional view of the variation of the second exemplary semiconductor structure along the vertical plane D-D' of FIG. 17A.

DETAILED DESCRIPTION

Figure 1:
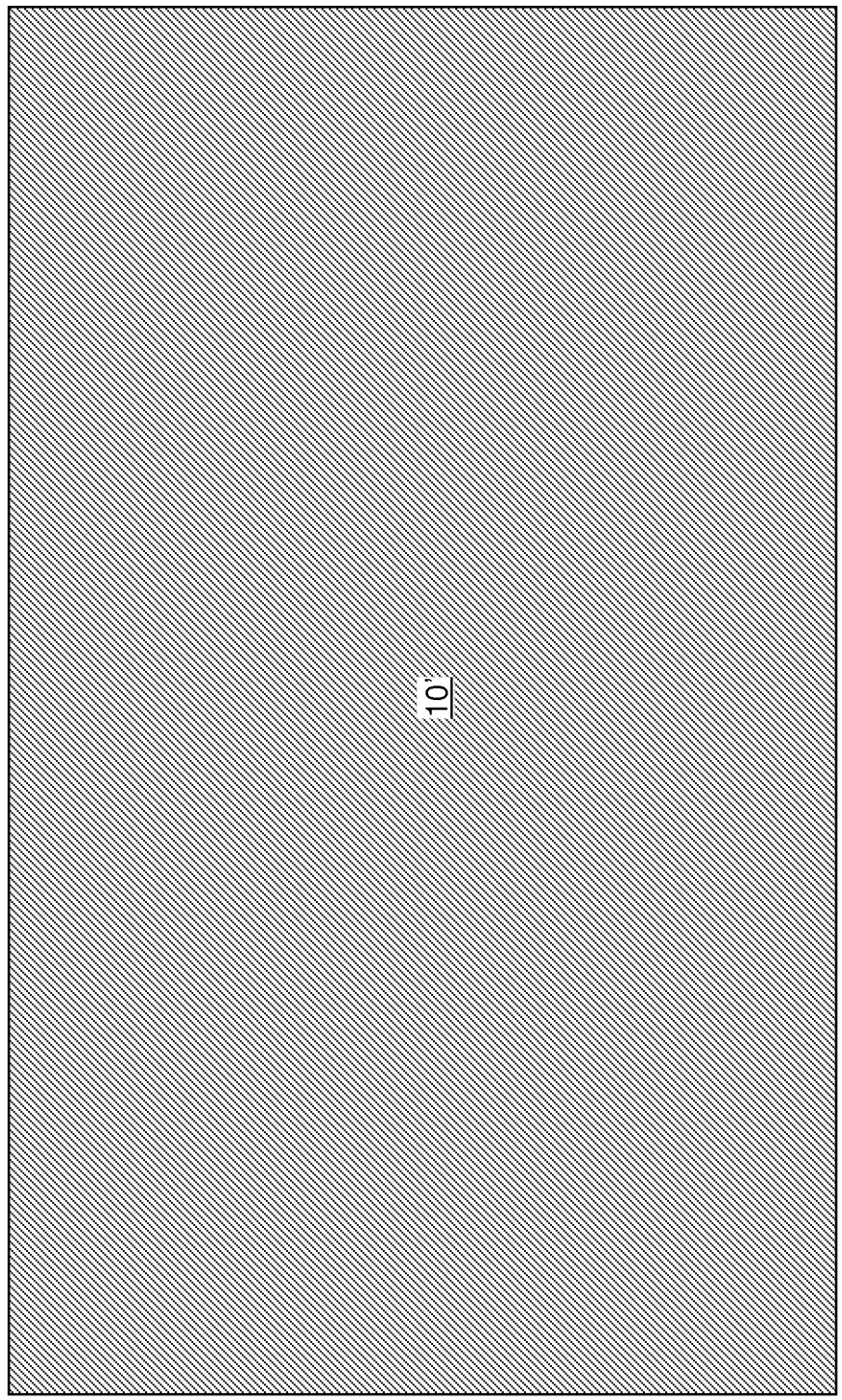
FIG. 1 is a vertical cross-sectional view of a first exemplary semiconductor structure according to a first embodiment of the present disclosure.

As stated above, the present disclosure relates to a dynamic random access memory (DRAM) cell including a finFET access transistor and a method of manufacturing the same. These aspects of the present disclosure are now described in detail with accompanying figures. It is noted that like reference numerals refer to like elements across different embodiments. The drawings are not necessarily drawn to scale.

Referring to FIG. 1, a first exemplary semiconductor structure according to a first embodiment of the present disclosure includes a semiconductor substrate 10', which can be a bulk semiconductor substrate. The semiconductor substrate includes a semiconductor material, which can be selected from elemental semiconductor materials (e.g., silicon, germanium, carbon, or alloys thereof), III-V semiconductor materials, or II-VI semiconductor materials. In one embodiment, the semiconductor substrate can include a single crystalline semiconductor material.

Referring to FIGS. 2A and 2B, an upper portion of the semiconductor substrate 10' can be patterned, by a combination of lithographic methods and an anisotropic etch, to form a plurality of semiconductor fins 30. For example, a photoresist layer 37 can be applied over the top surface of the semiconductor substrate 10' and lithographically patterned to mask portions of the semiconductor substrate 10' in which the plurality of semiconductor fins 30 is subsequently formed. The pattern in the photoresist layer 37 can be transferred into the upper portion of the semiconductor substrate 10' to form the plurality of semiconductor fins 30. The remaining portion of the semiconductor substrate 10' underlying the plurality of semiconductor fins 30 is herein referred to as a semiconductor material layer 10. The semiconductor material layer 10 functions as a substrate mechanically supporting the plurality of semiconductor fins 30. The plurality of semiconductor fins 30 and the semiconductor material layer 10 collectively constitute a contiguous semiconductor material portion. In one embodiment, the entirety of the contiguous semiconductor material portion can be single crystalline.

The height of the semiconductor fins 30 can be from 5 nm to 1,000 nm, although lesser and greater heights can also be employed. The plurality of semiconductor fins 30 and the semiconductor material layer 10 can be doped with electrical dopants, i.e., p-type dopants or n-type dopants, or can be intrinsic. In one embodiment, the entirety of the plurality of semiconductor fins 30 and the semiconductor material layer 10 can have a same type of doping, which is herein referred to as a first conductivity type.

As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a channel region is located within a semiconductor fin.

Each semiconductor fin 30 is laterally bound by a pair of lengthwise sidewalls and a pair of widthwise sidewalls. As used herein, a "lengthwise direction" of an element refers to a direction about which the moment of inertia of the element becomes a minimum. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, each of the plurality of semiconductor fins 30 can have a rectangular horizontal cross-sectional shape.

In one embodiment, lengthwise sidewalls of multiple semiconductor fins 30 within a same row can be within a pair of vertical planes laterally spaced from each other by the width of a semiconductor fin 30. In one embodiment, widthwise sidewalls of multiple semiconductors within a same column can be within a pair of vertical planes laterally spaced from each other by the length of a semiconductor fin 30. In one embodiment, the plurality of semiconductor fins 30 can be within a two-dimensional array having a first pitch along the lengthwise direction of the semiconductor fins 30 and a second pitch along the lengthwise direction of the semiconductor fins.

Figure 3A:
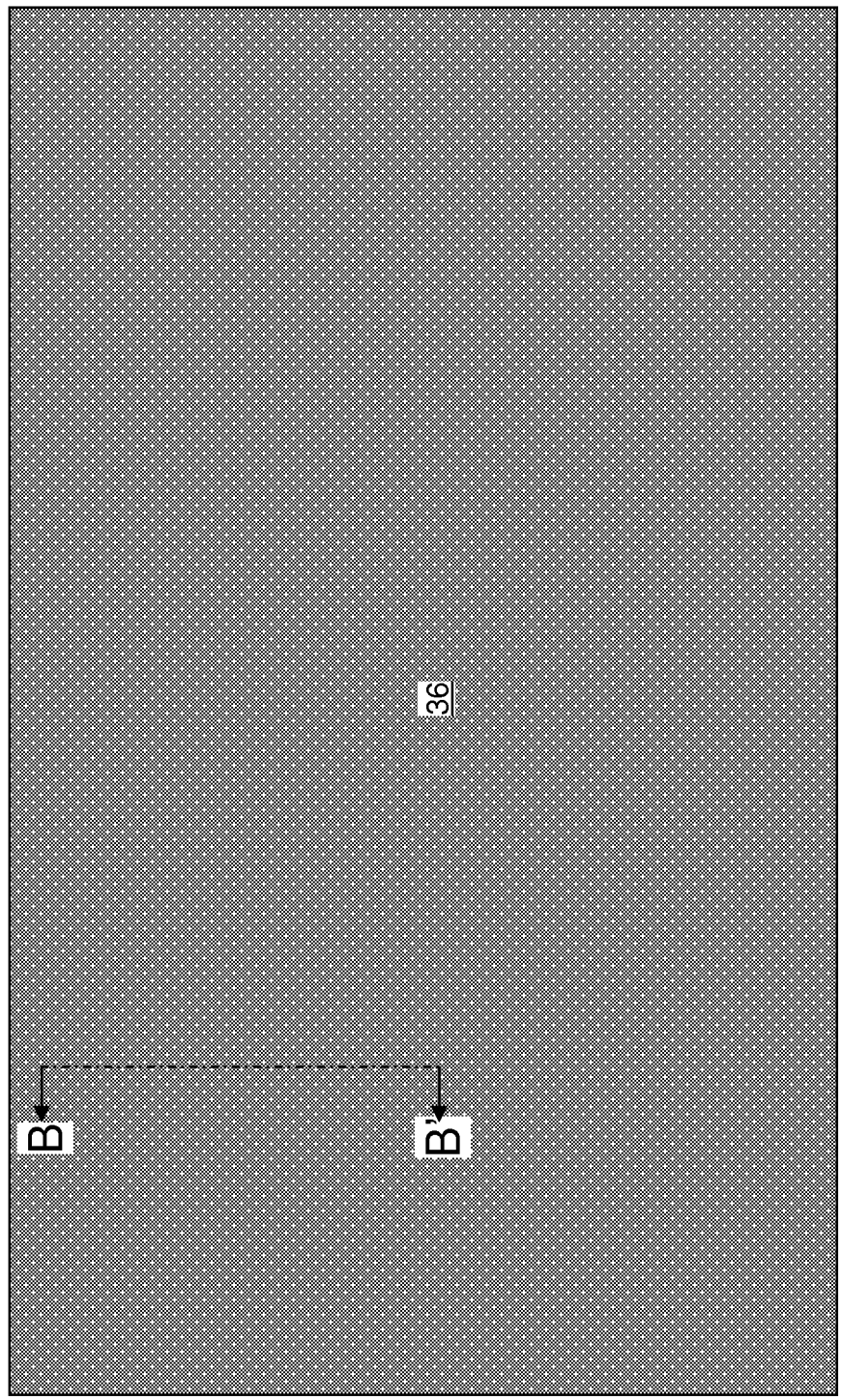
FIG. 3A is a top-down view of the first exemplary semiconductor structure after formation of a shallow trench isolation structure layer and a hard mask layer according to the first embodiment of the present disclosure.
Figure 3B:
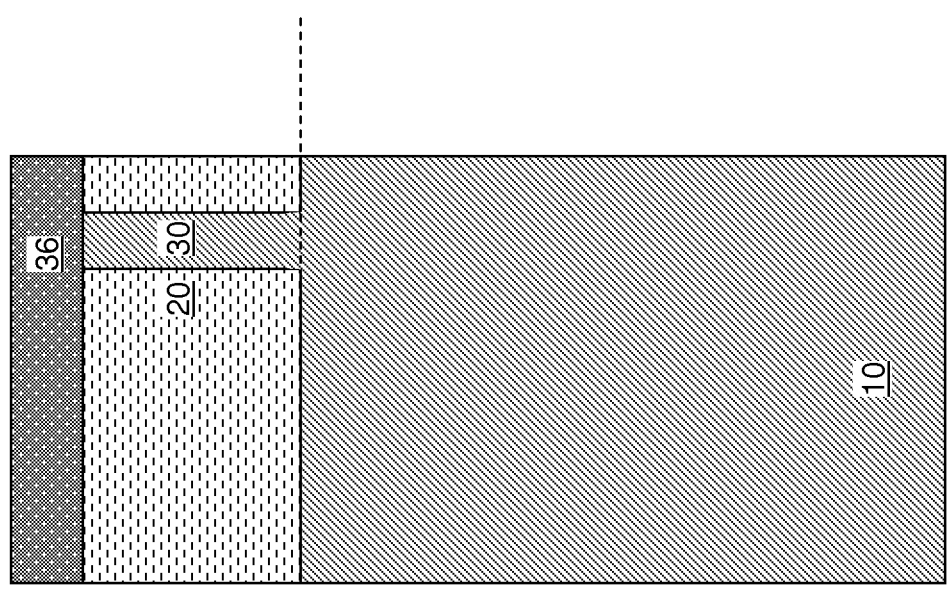
FIG. 3B is a vertical cross-sectional view of the first exemplary semiconductor structure along the vertical plane B-B' of FIG. 3A.

Referring to FIGS. 3A and 3B, a shallow trench isolation layer 20 is formed among the plurality of semiconductor fins 30. The shallow trench isolation layer 20 includes a dielectric material such as silicon oxide. The shallow trench isolation layer 20 can be formed by depositing a dielectric material over the semiconductor fins 30 and the semiconductor material layer 10. The deposition of the dielectric material can be performed, for example, by chemical vapor deposition or spin coating. Excess portions of the deposited dielectric material can be removed from above the top surfaces of the semiconductor fins 30, for example, by planarization (such as chemical mechanical planarization (CMP)). The shallow trench isolation layer 30 laterally surrounds the plurality of semiconductor fins 30. The top surface of the shallow trench isolation layer 30 can be coplanar with the top surfaces of the plurality of semiconductor fins 30.

A hard mask layer 36 can be deposited over the shallow trench isolation layer 20, for example, by chemical vapor deposition (CVD). The hard mask layer 36 can include one or more layers that can be employed as an etch mask for forming trenches 11 in the semiconductor material layer 10. In one embodiment, the hard mask layer 36 can include a dielectric material such as a doped or undoped silicon oxide, silicon nitride, a dielectric metal nitride, or a dielectric metal oxide. The thickness of the hard mask layer 36 can be from 100 nm to 2,000 nm, although lesser and greater thicknesses can also be employed.

Figure 4A:
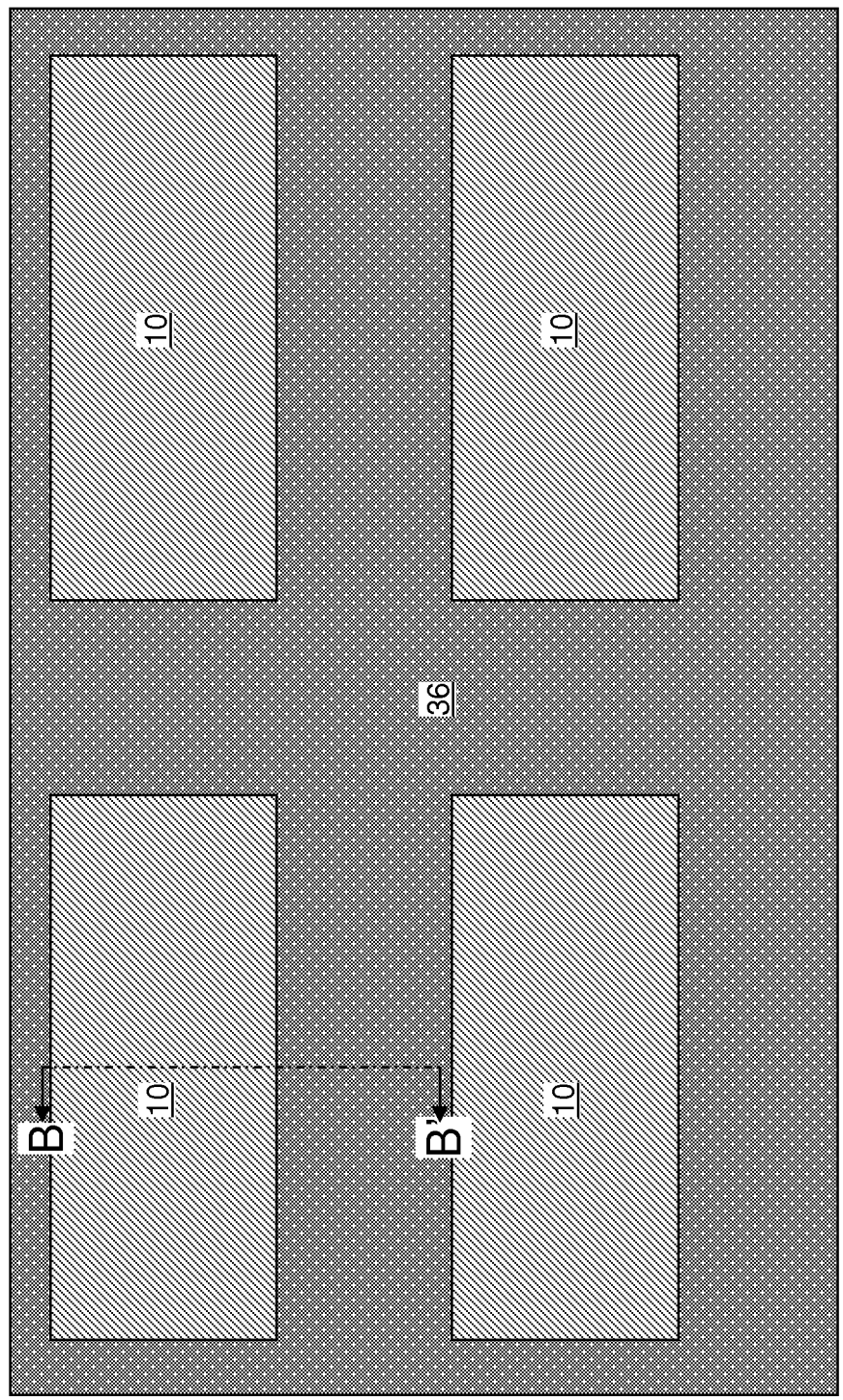
FIG. 4A is a top-down view of the first exemplary semiconductor structure after formation of trenches according to the first embodiment of the present disclosure.
Figure 4B:
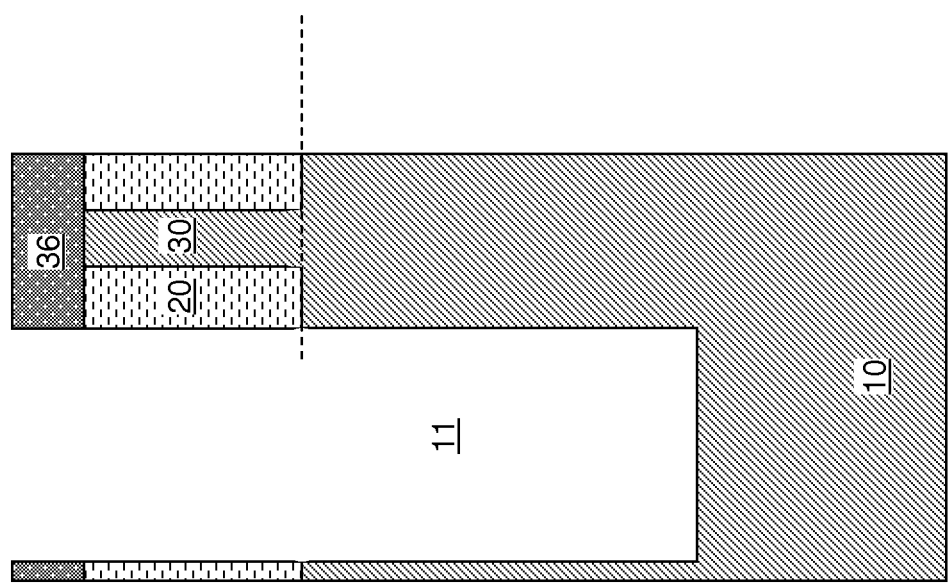
FIG. 4B is a vertical cross-sectional view of the first exemplary semiconductor structure along the vertical plane B-B' of FIG. 4A.

Referring to FIGS. 4A and 4B, a photoresist layer (not shown) can be applied over the hard mask layer 36, and can be lithographically patterned to form openings corresponding to the areas of trenches 11 to be subsequently formed. The pattern in the photoresist layer can be transferred into the hard mask layer 36. Subsequently, the pattern in the hard mask layer 36 can be transferred through the shallow trench isolation layer 20 and an upper portion of the semiconductor material layer 10 by an anisotropic etch that employs the hard mask layer 36 as an etch mask. A trench 11 can be formed for each opening in the hard mask layer 36. The photoresist can be removed by ashing, or can be consumed during the etch process that forms the trenches 11.

In one embodiment, the locations of the openings in the photoresist layer and the hard mask layer 36 can be selected such that entire periphery of each trench 11 can be formed between a first vertical plane including a proximal lengthwise sidewall of a first semiconductor fin 30 within a neighboring pair of the semiconductor fins 30 and a second vertical plane including a proximal lengthwise sidewall of a second semiconductor fin within the neighboring pair of the semiconductor fins 30. Within the neighboring pair of the semiconductor fins 30, the first semiconductor fin and the second semiconductor fin are laterally spaced from each other by the widthwise direction of the semiconductor fins 30, i.e., along the horizontal direction perpendicular to the lengthwise direction of each semiconductor fin 30. Further, the entire periphery of each trench 11 can be formed between a pair of vertical planes including two widthwise sidewalls of the first semiconductor fin, which can also include two widthwise sidewalls of the second semiconductor fin.

The sidewalls of each trench 11 can be substantially vertically coincident among the various layers (36, 20, 10) through which the trench 11 extends. As used herein, sidewalls of multiple elements are "vertically coincident" if the sidewalls of the multiple elements overlap in a top-down view s. As used herein, sidewalls of multiple elements are "substantially vertically coincident" if the lateral offset of the sidewalls of the multiple elements from a perfectly vertical surface is within three times the root mean square of surface roughness of sidewalls of each element.

The depth of each trench 11 as measured from the plane of the topmost surface of the semiconductor fins 30 to the bottom surface of the trench 11 can be from 500 nm to 10 microns, although lesser and greater depths can also be employed. In one embodiment, the trenches 11 can be deep trenches. As used herein, a "deep trench" refers to a trench that having a depth greater than 2.0 microns, which is the maximum depth for ion implantation as known in the art. The lateral dimensions of each trench 11 can be limited by the lithographic capabilities, i.e., the ability of a lithographic tool to print the image of an opening on the photoresist layer.

Referring to FIGS. 5A and 5B, a buried plate 12 can be formed by doping a portion of the semiconductor material layer 10 in proximity of sidewalls of each trench 11. Dopants can be introduced, for example, by outdiffusion from a dopant-including disposable material (such as a doped silicate glass) or by ion implantation as known in the art. Further, any other method of forming a buried plate 12 in the semiconductor material layer 10 of the semiconductor material layer 10 can be employed in lieu of outdiffusion from a dopant-including disposable material or ion implantation.

In one embodiment, the buried plate 12 can be doped with dopants of a second conductivity type which is the opposite of the first conductivity type. For example, the first conductivity type can be p-type and the second conductivity type can be n-type, or vice versa. A p-n junction is formed between the remaining portion of the semiconductor material layer 10 and the buried plate 12. The dopant concentration in the buried plate 12 can be, for example, from $1.0 \times 10^{18}/cm^3$ to $2.0 \times 10^{21}/cm^3$, and typically from $5.0 \times 10^{18}/cm^3$ to $5.0 \times 10^{19}/cm^3$, although lesser and greater dopant concentrations can also be employed.

A node dielectric 42 can be deposited conformally on all physically exposed sidewalls in each trench 11 and on the top surface of the hard mask layer 36. The node dielectric 42 can include any dielectric material that can be employed as a node dielectric material in a capacitor known in the art. For example, the node dielectric 42 can include at least one of silicon nitride and a dielectric metal oxide material such as high dielectric constant (high-k) gate dielectric material as known in the art.

A conductive material can be deposited to completely fill each trench 11. The conductive material can be a metallic material or a doped semiconductor material. The metallic material can be an elemental metal such as W, Ti, Ta, Cu, or Al, or an ally of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material can be deposited by physical vapor deposition (PVD), chemical vapor deposition (CVD), electroplating, electroless plating, or a combination thereof. The conductive material is deposited to a thickness that is sufficient to fill each trench 11 completely.

Excess portions of the conductive material can be removed from above the top surface of the hard mask layer 36, for example, by chemical mechanical planarization. Subsequently, the conductive material can be vertically recessed to a level between the top surface of the shallow trench isolation layer 20 and the bottom surface of the shallow trench isolation layer 20 by a recess etch. The recess etch of the conductive material layer can employ an anisotropic etch such as a reactive ion etch, an isotropic etch such as a wet etch, or a combination thereof. The recess etch can be selective to the material of the node dielectric 42.

An inner electrode 44 including the conductive material is formed in each trench 11. The topmost surface of the inner electrode 44 is substantially planar, and is located between the level of the top surface of the shallow trench isolation layer 20 and the level of the bottom surface of the shallow trench isolation layer 20. A surface is substantially planar if the planarity of the surface is limited by microscopic variations in surface height that accompanies semiconductor processing steps known in the art. A cavity 45 is formed above the inner electrode 44.

The physically exposed portions of the node dielectrics 42 can be patterned by an etch, which can be a wet etch. For example, if the node dielectrics 42 include silicon nitride, the physically exposed portions of the node dielectric 42 can be removed by a wet etch employing hot phosphoric acid. Each remaining portion of the node dielectric 42 within each trench 11 constitutes a node dielectric 42. Each adjoined set of a buried plate 12, a node dielectric 42, and an inner electrode 44 constitute a trench capacitor (12, 42, 44). Each buried plate 12 is an outer node of the trench capacitor, the node dielectric 42 is the dielectric separating the outer electrode from the inner electrode, and the inner electrode 44 is the inner electrode of the trench capacitor. The trench capacitor is embedded within the combination of the semiconductor material layer 10 and the shallow trench isolation layer 20. The shallow trench isolation layer 20 overlies the buried plate 12 (i.e., the outer electrode).

The entirety of each node dielectric 42 can be formed within the substrate including the semiconductor material layer 10, the buried plates 12, and the shallow trench isolation layer 20. The entirety of each node dielectric 42 can be formed between a first vertical plane VP1 including a proximal lengthwise sidewall of a first semiconductor fin within a neighboring pair of semiconductor fins 30 and a second vertical plane VP2 including a proximal lengthwise sidewall of a second semiconductor fin within the neighboring pair of the semiconductor fins 30. The semiconductor fins in the neighboring pair of semiconductor fins 30 are laterally separated from each other along a direction perpendicular to the lengthwise direction of the semiconductor fins 30. Further, the entirety of each node dielectric 42 can be formed between a pair of vertical planes VW including two widthwise sidewalls of the first semiconductor fin. In one embodiment, the pair of vertical planes including the two widthwise sidewalls of the first semiconductor fin can also include two widthwise sidewalls of the second semiconductor fin.

Figure 6A:
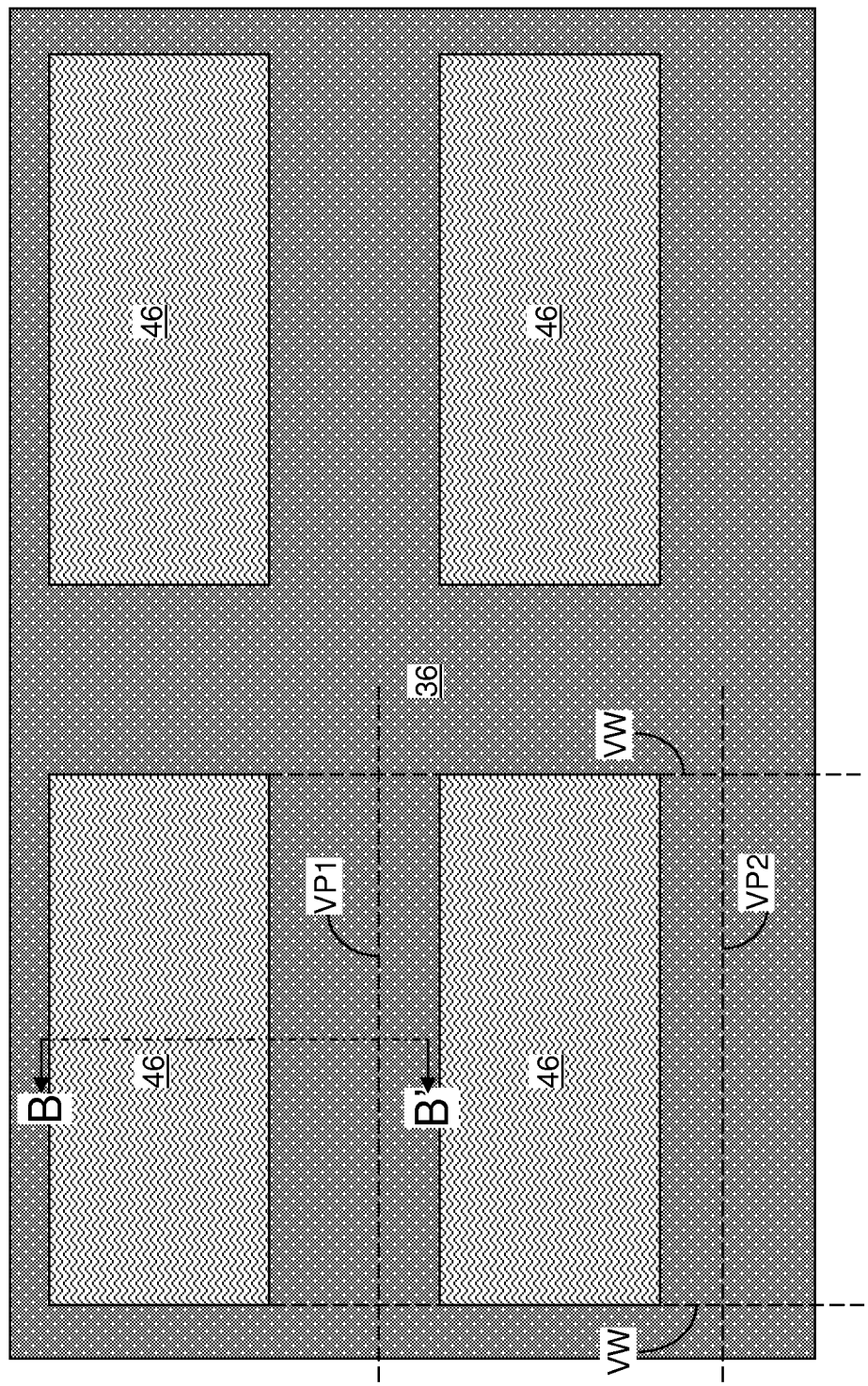
FIG. 6A is a top-down view of the first exemplary semiconductor structure after formation of trench top dielectric portions according to the first embodiment of the present disclosure.
Figure 6B:
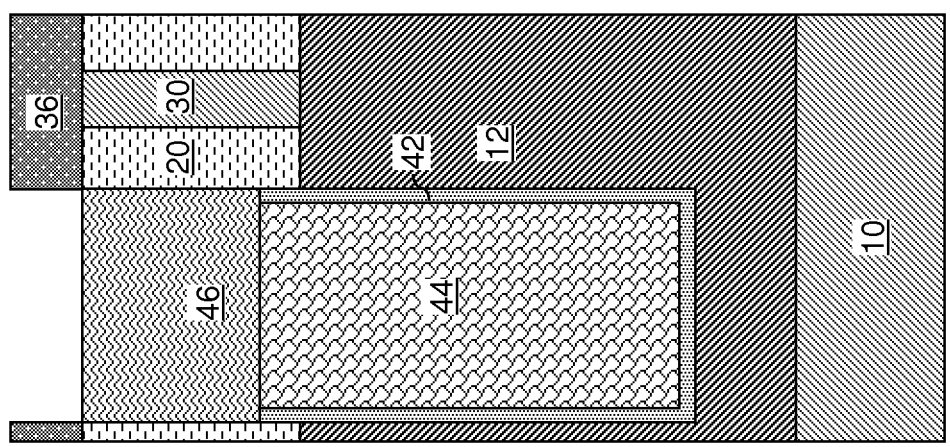
FIG. 6B is a vertical cross-sectional view of the first exemplary semiconductor structure along the vertical plane B-B' of FIG. 6A.

Referring to FIGS. 6A and 6B, a dielectric material can be deposited within the cavity 45, and can be subsequently planarized employing the hard mask layer 36 as a stopping layer to remove excess portions of the deposited dielectric material from above the top surface of the hard mask layer 36. The remaining portion of the deposited dielectric material can be recessed relative to the top surface of the hard mask layer 36 by a recess etch to a height about the top surface of the shallow trench isolation layer 20 to form a trench top dielectric portion 46 within each trench. The dielectric material of the trench top dielectric portion 46 can be different from the dielectric material of the hard mask layer 36. For example, the dielectric material of the hard mask layer 36 can be silicon nitride, and dielectric material of the trench top dielectric portion 46 can be silicon oxide. The dielectric material of the trench top dielectric portion 46 can be deposited, for example, by chemical vapor deposition (CVD).

Each trench top dielectric portion 46 can be formed in a region laterally bounded by the first vertical plane VP1 including the proximal lengthwise sidewall of the first semiconductor fin within a neighboring pair of semiconductor fins 30 and a second vertical plane VP2 including the proximal lengthwise sidewall of a second semiconductor fin within the neighboring pair of the semiconductor fins 30. Further, the entirety of each trench top dielectric portion 46 can be formed between the pair of vertical planes VW including two widthwise sidewalls of a semiconductor fin 30.

Figure 7A:
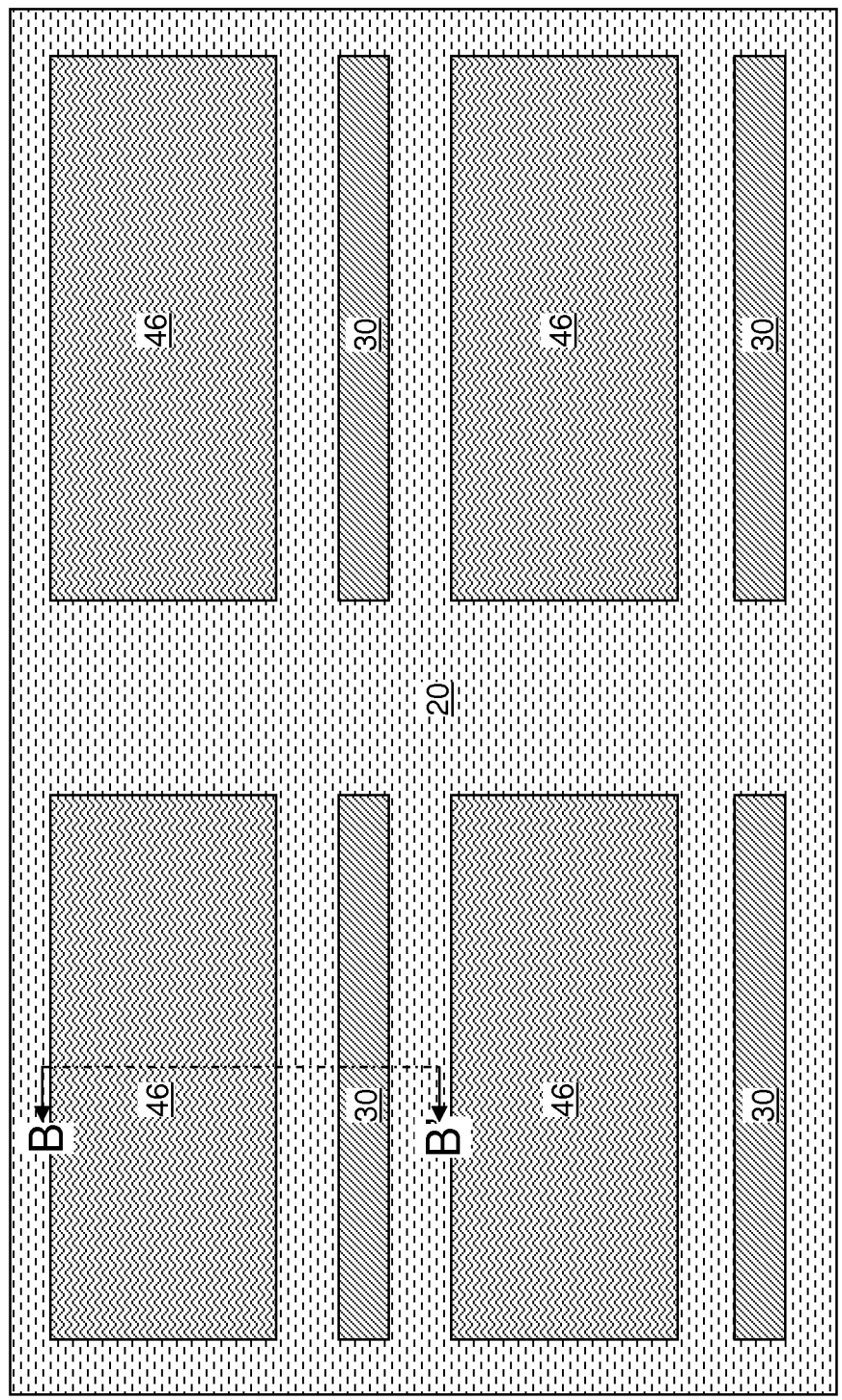
FIG. 7A is a top-down view of the first exemplary semiconductor structure after removal of the hard mask layer and recessing of the shallow trench isolation layer and the trench top dielectric portions according to the first embodiment of the present disclosure.
Figure 7B:
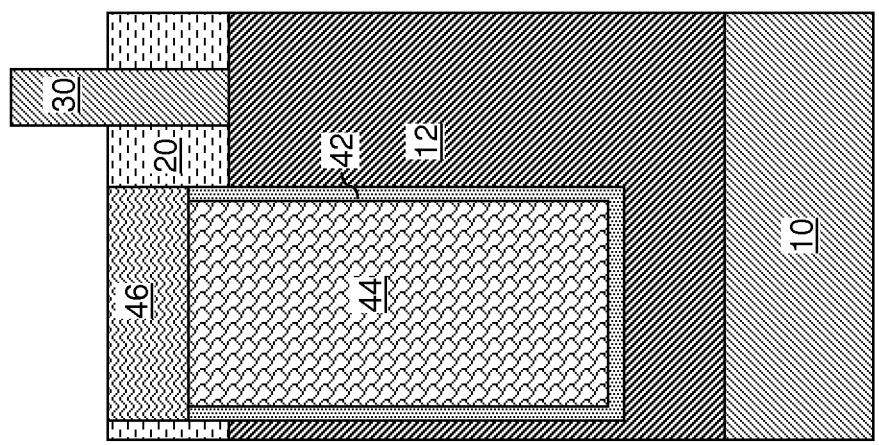
FIG. 7B is a vertical cross-sectional view of the first exemplary semiconductor structure along the vertical plane B-B' of FIG. 7A.

Referring to FIGS. 7A and 7B, the hard mask layer 36 can be removed, for example, by a wet etch selective to the trench top dielectric portion 46 and the shallow trench isolation layer 20. In one embodiment, the hard mask layer 36 can include silicon nitride, the trench top dielectric portion 46 and the shallow trench isolation layer 20 include silicon oxide, and the removal of the hard mask layer 36 selective to the trench top dielectric portion 46 and the shallow trench isolation layer 20 can be effected by a wet etch employing hot phosphoric acid.

The shallow trench isolation layer 20 and the trench top dielectric portions 46 are recessed relative to the top surfaces of the semiconductor fins 30. An etch process that is selective to the semiconductor material of the semiconductor fins 30 can be employed to recess the shallow trench isolation layer 20 and the trench top dielectric portions 46. For example, if the shallow trench isolation layer 20 and the trench top dielectric portion 46 include silicon oxide, a wet etch employing hydrofluoric acid can be employed to recess the shallow trench isolation layer 20 and the trench top dielectric portions 46. Surfaces of an upper portion of each semiconductor fin 30 are physically exposed.

Figure 8A:
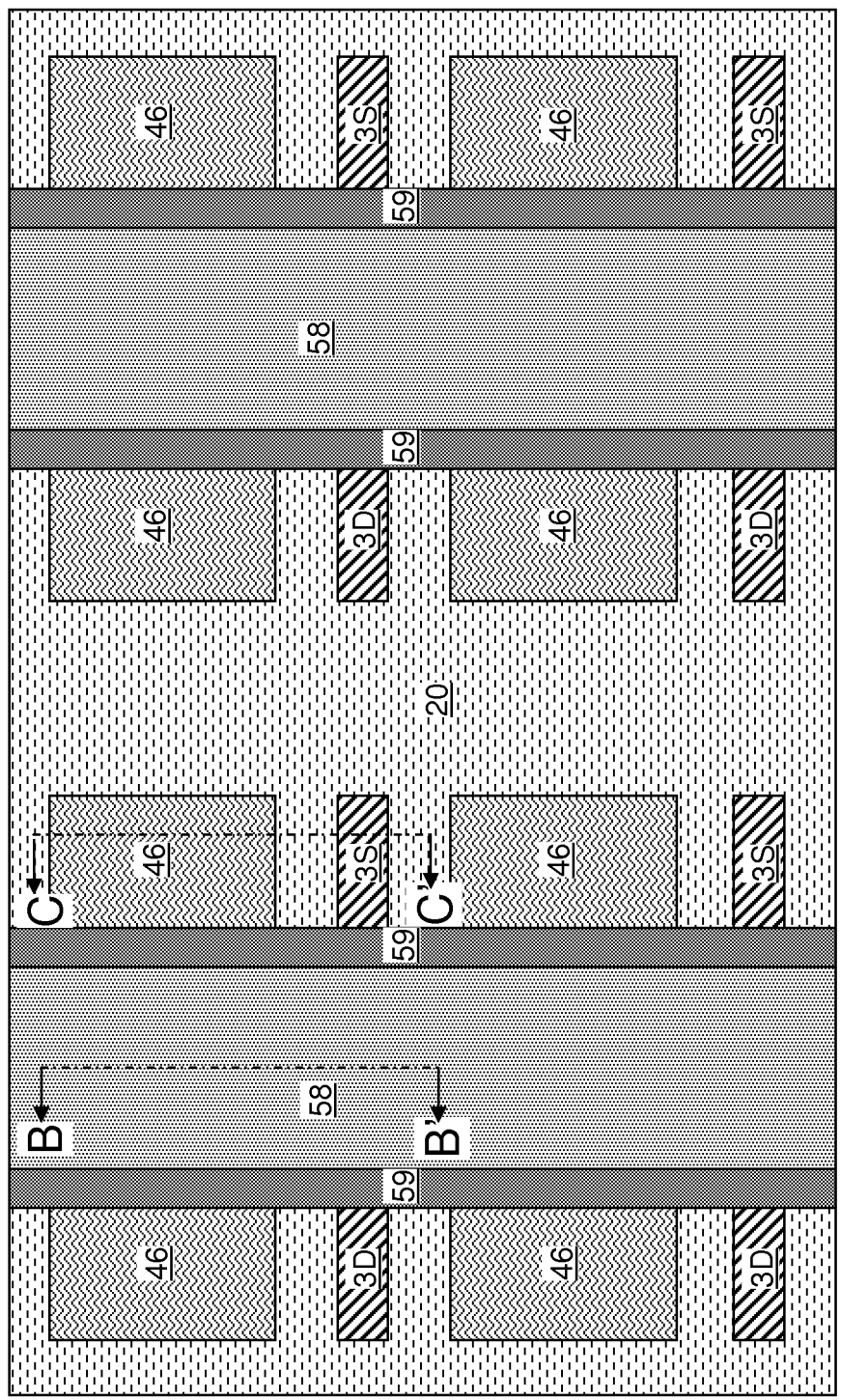
FIG. 8A is a top-down view of the first exemplary semiconductor structure after formation of gate structures, source regions, drain regions, and gate spacers according to the first embodiment of the present disclosure.
Figure 8C:
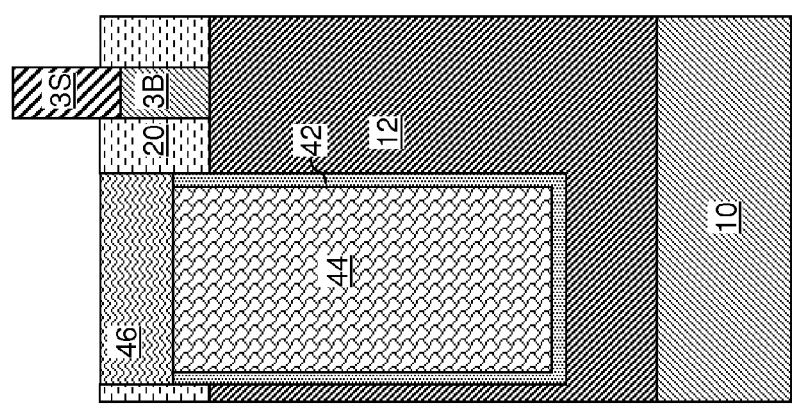
FIG. 8C is a vertical cross-sectional view of the first exemplary semiconductor structure along the vertical plane C-C' of FIG. 8A.
Figure 8B:
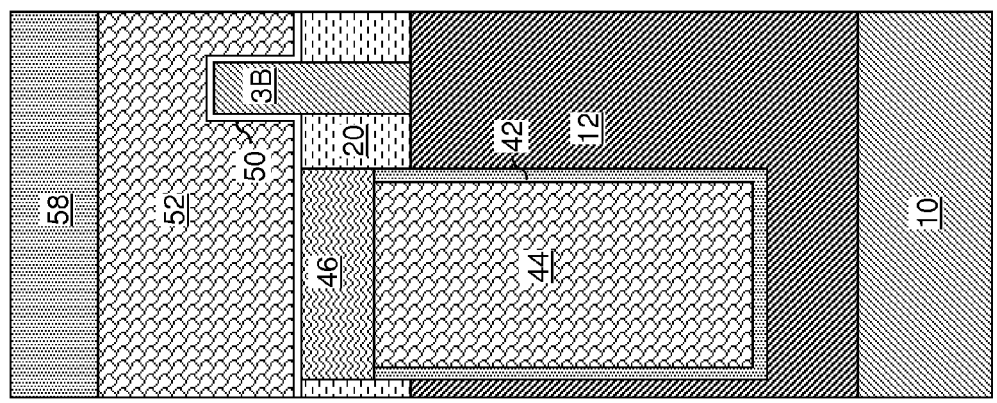
FIG. 8B is a vertical cross-sectional view of the first exemplary semiconductor structure along the vertical plane B-B' of FIG. 8A.
Figure 9A:
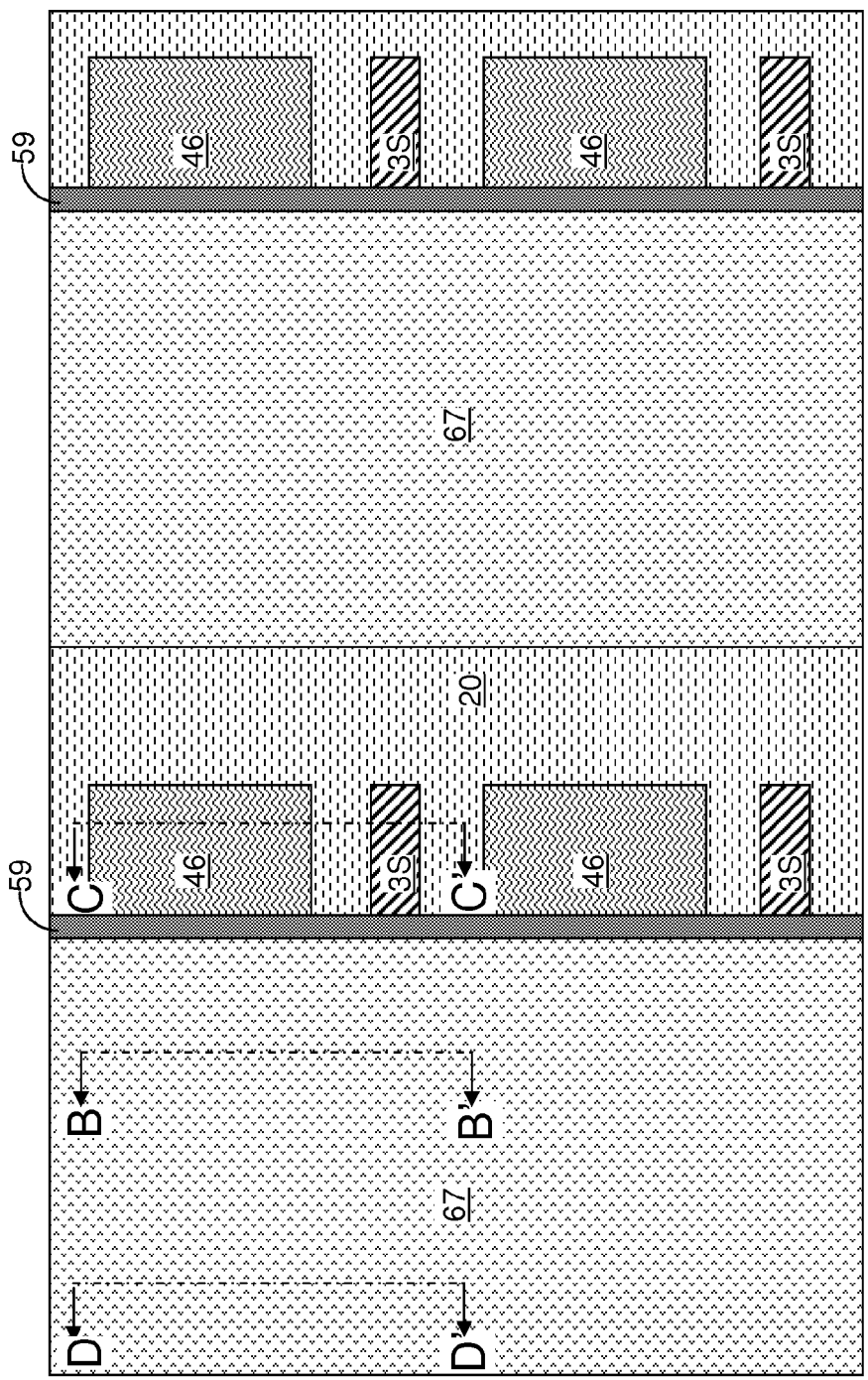
FIG. 9A is a top-down view of the first exemplary semiconductor structure after formation of a patterned mask layer according to the first embodiment of the present disclosure.
Figure 9D:
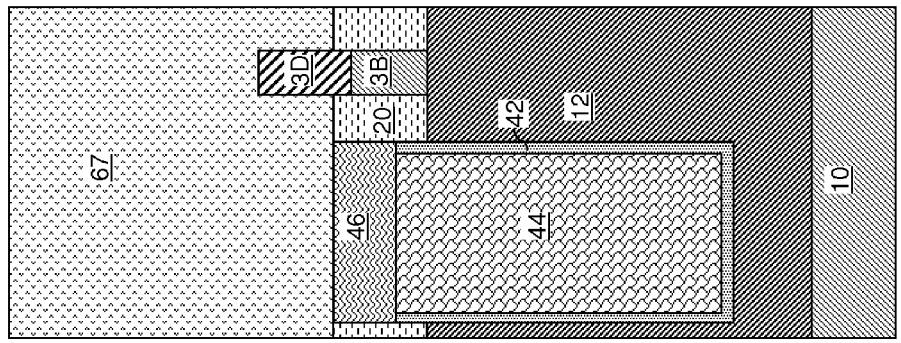
FIG. 9D is a vertical cross-sectional view of the first exemplary semiconductor structure along the vertical plane D-D' of FIG. 9A.
Figure 9C:
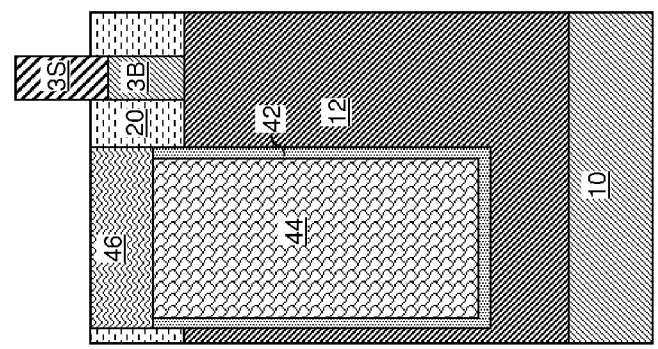
FIG. 9C is a vertical cross-sectional view of the first exemplary semiconductor structure along the vertical plane C-C' of FIG. 9A.
Figure 9B:
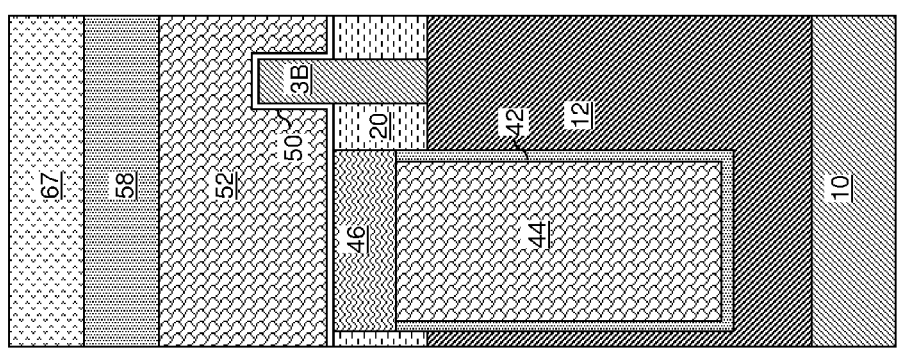
FIG. 9B is a vertical cross-sectional view of the first exemplary semiconductor structure along the vertical plane B-B' of FIG. 9A.
Figure 10A:
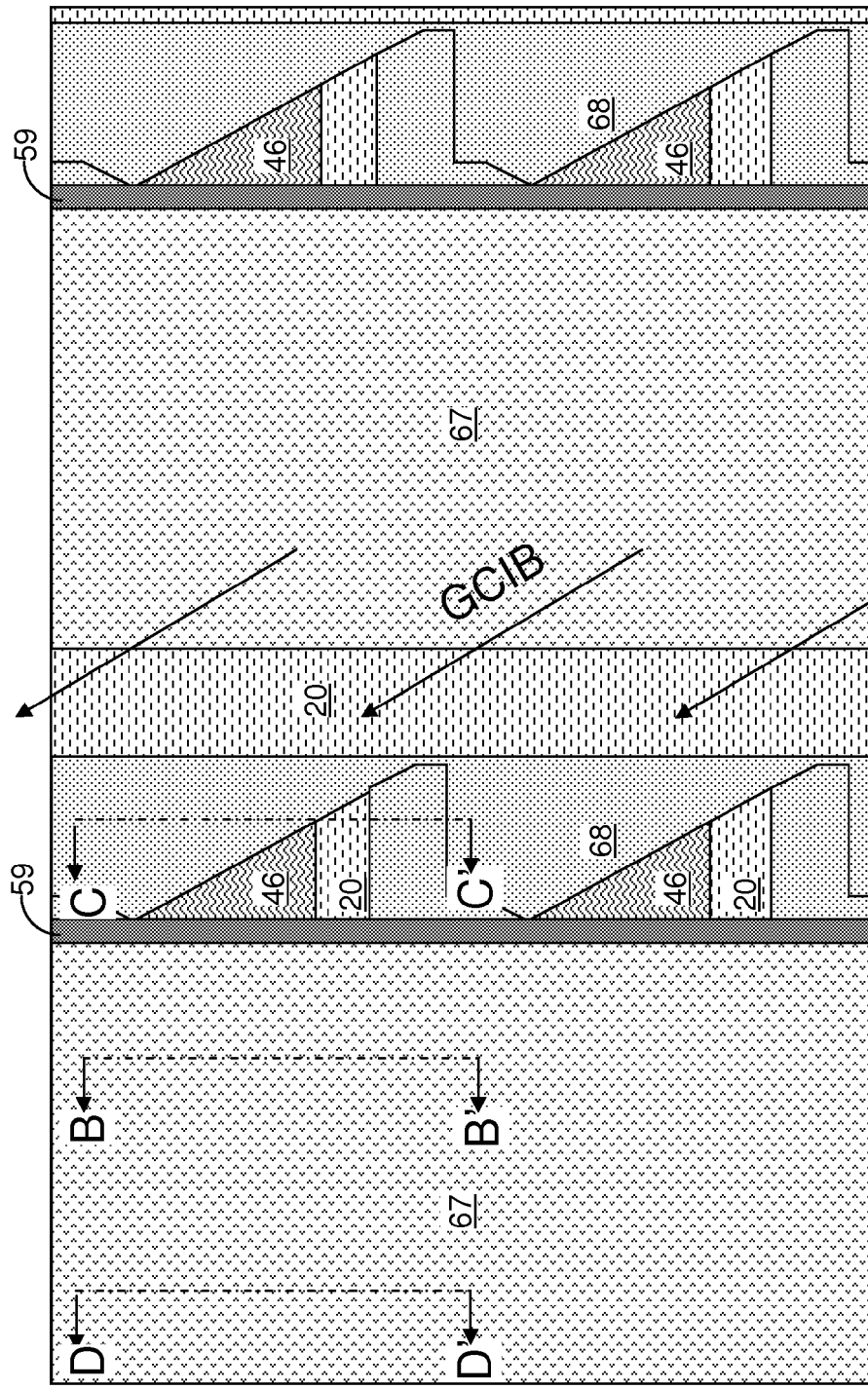
FIG. 10A is a top-down view of the first exemplary semiconductor structure after formation of a dielectric material portion employing a gas cluster ion beam deposition process according to the first embodiment of the present disclosure.
Figure 10D:
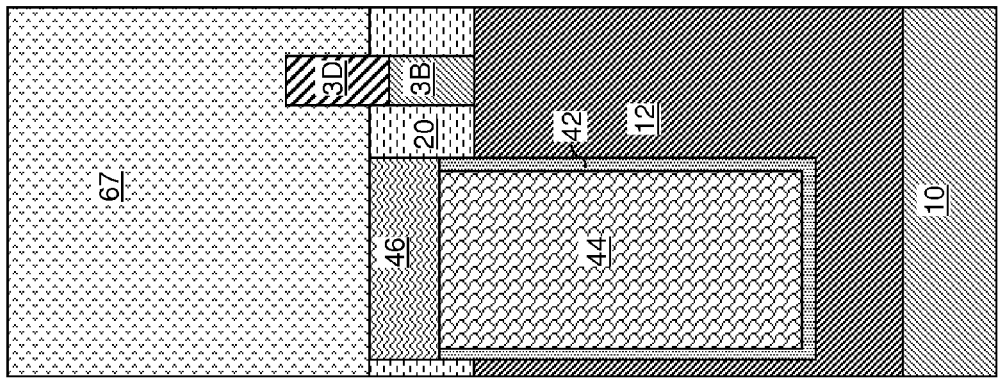
FIG. 10D is a vertical cross-sectional view of the first exemplary semiconductor structure along the vertical plane D-D' of FIG. 10A.
Figure 10C:
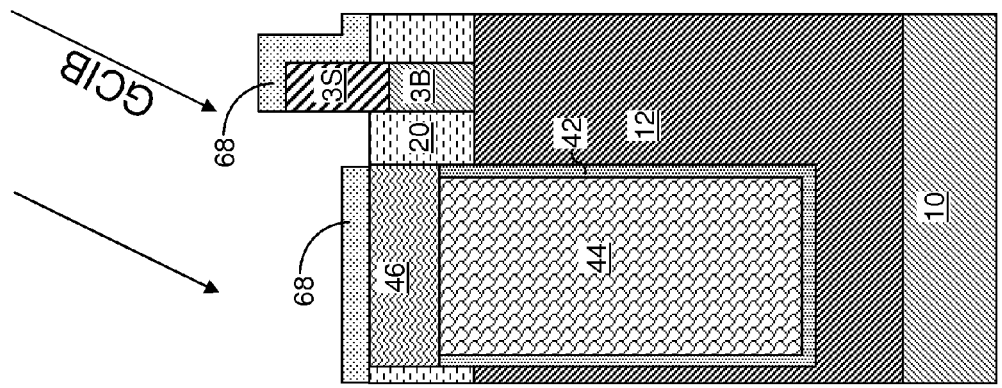
FIG. 10C is a vertical cross-sectional view of the first exemplary semiconductor structure along the vertical plane C-C' of FIG. 10A.
Figure 10B:
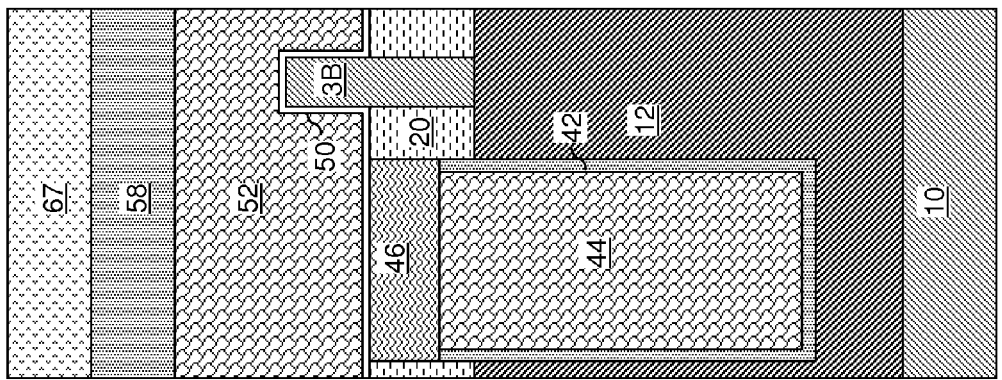
FIG. 10B is a vertical cross-sectional view of the first exemplary semiconductor structure along the vertical plane B-B' of FIG. 10A.
Figure 11A:
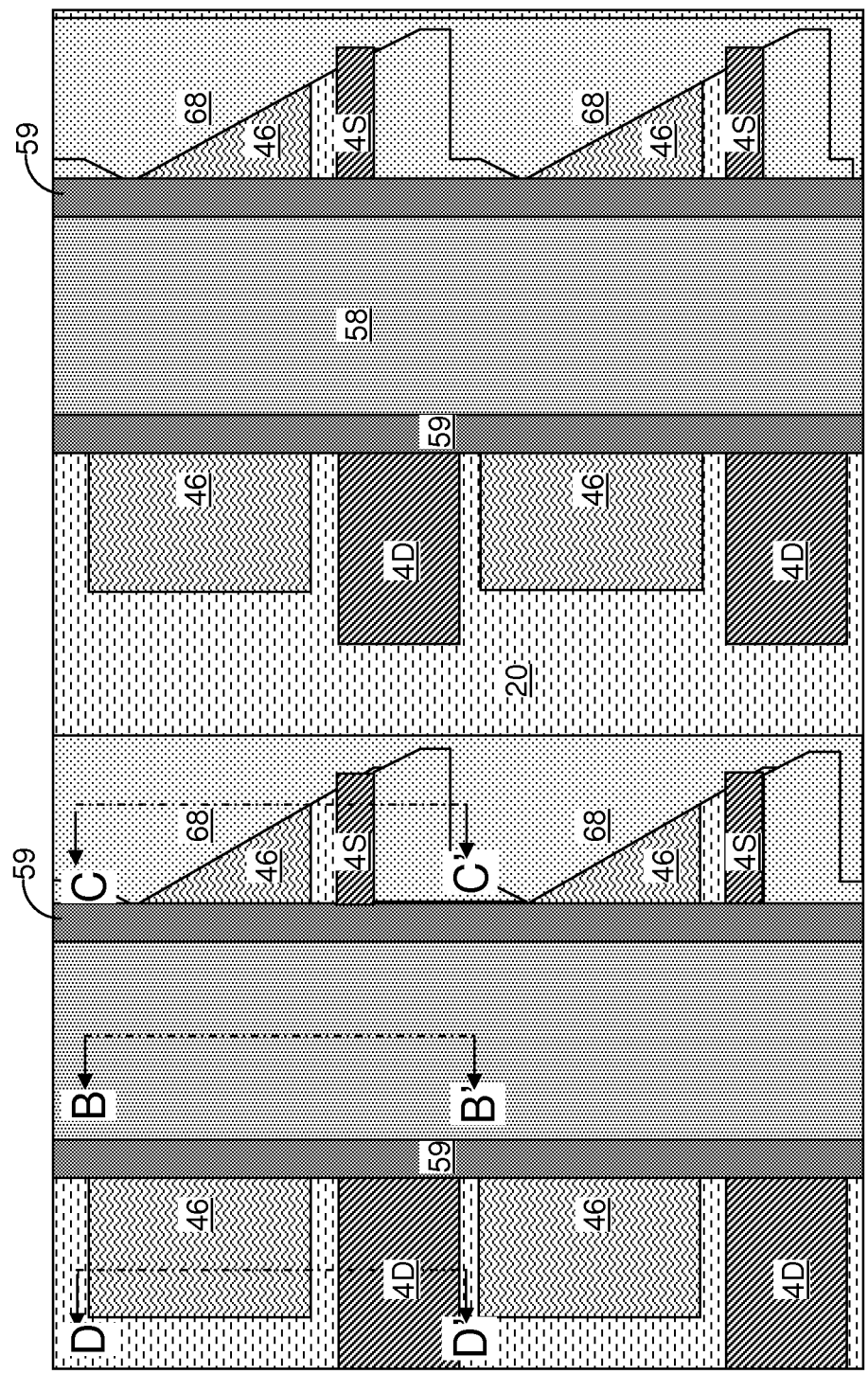
FIG. 11A is a top-down view of the first exemplary semiconductor structure after formation of raised active regions according to the first embodiment of the present disclosure.
Figure 11D:
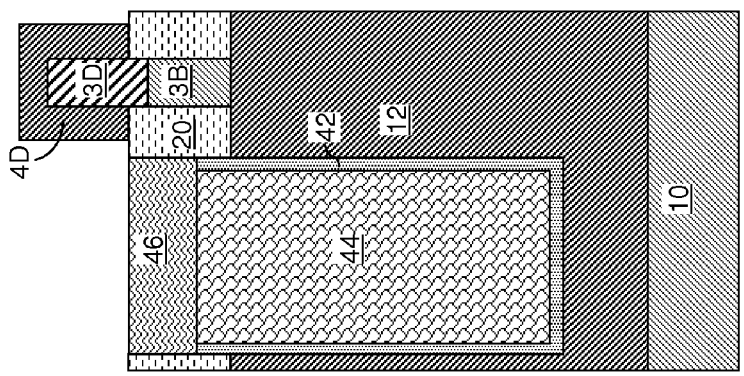
FIG. 11D is a vertical cross-sectional view of the first exemplary semiconductor structure along the vertical plane D-D' of FIG. 11A.
Figure 11C:
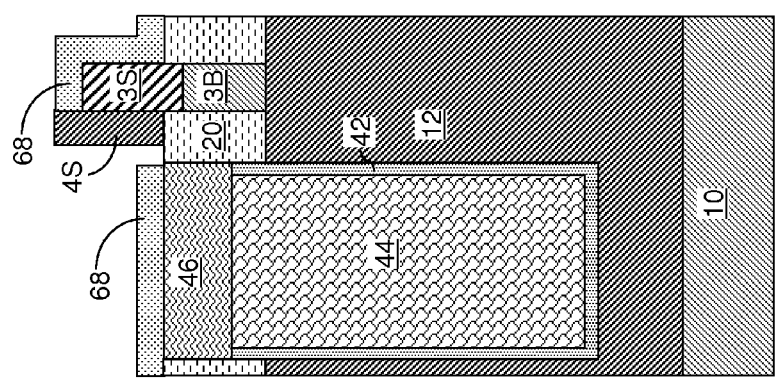
FIG. 11C is a vertical cross-sectional view of the first exemplary semiconductor structure along the vertical plane C-C' of FIG. 11A.
Figure 11B:
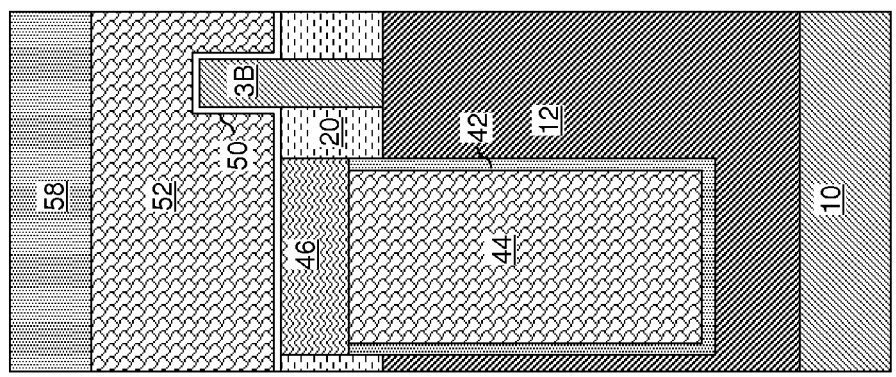
FIG. 11B is a vertical cross-sectional view of the first exemplary semiconductor structure along the vertical plane B-B' of FIG. 11A.
Figure 12A:
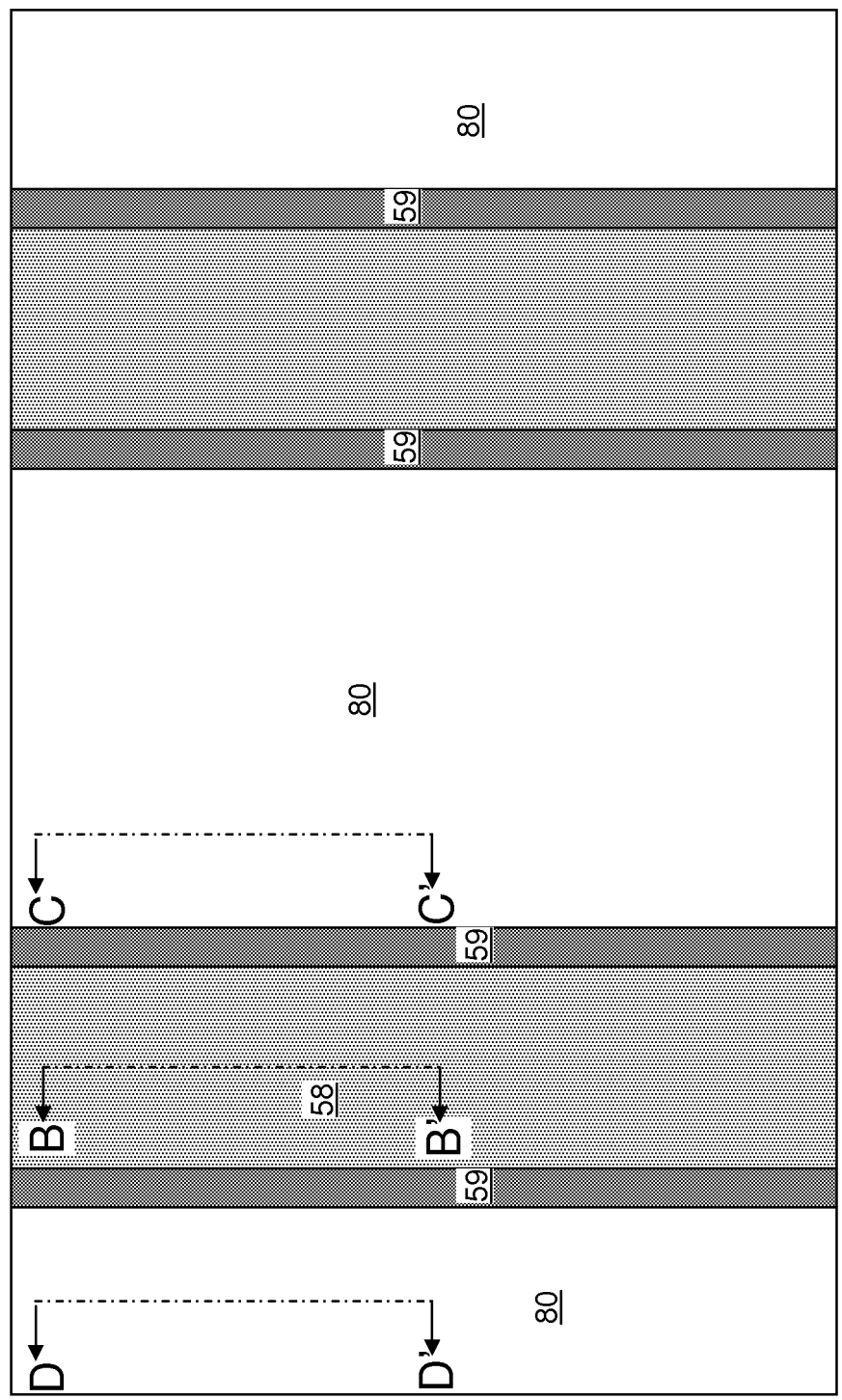
FIG. 12A is a top-down view of the first exemplary semiconductor structure after forming a planarization dielectric layer according to the first embodiment of the present disclosure.
Figure 12D:
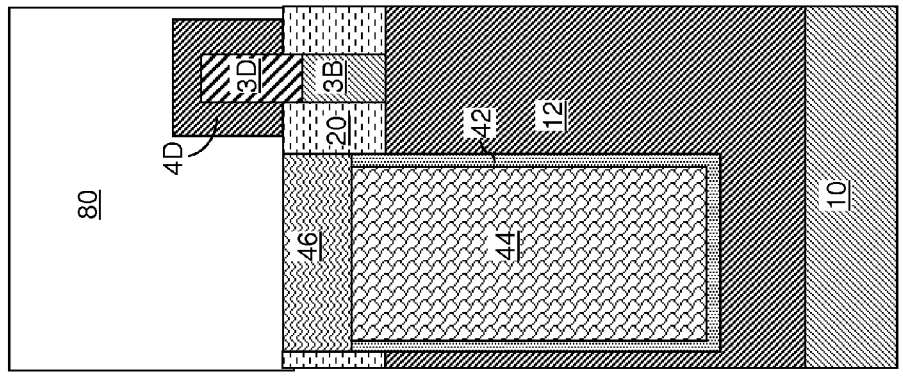
FIG. 12D is a vertical cross-sectional view of the first exemplary semiconductor structure along the vertical plane D-D' of FIG. 12A.
Figure 12C:
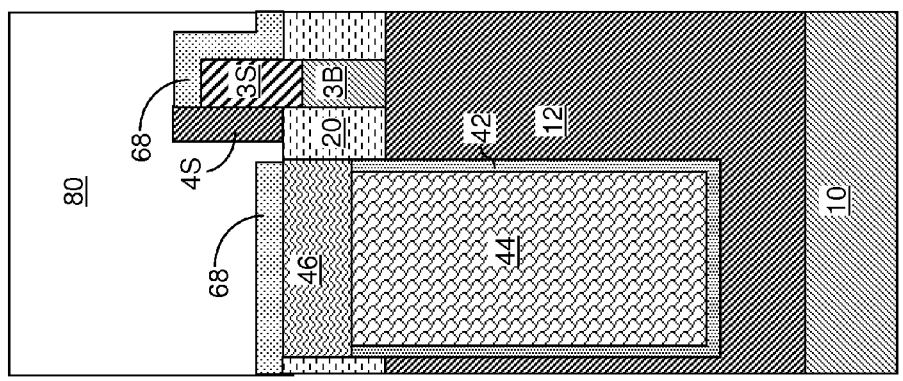
FIG. 12C is a vertical cross-sectional view of the first exemplary semiconductor structure along the vertical plane C-C' of FIG. 12A.
Figure 12B:
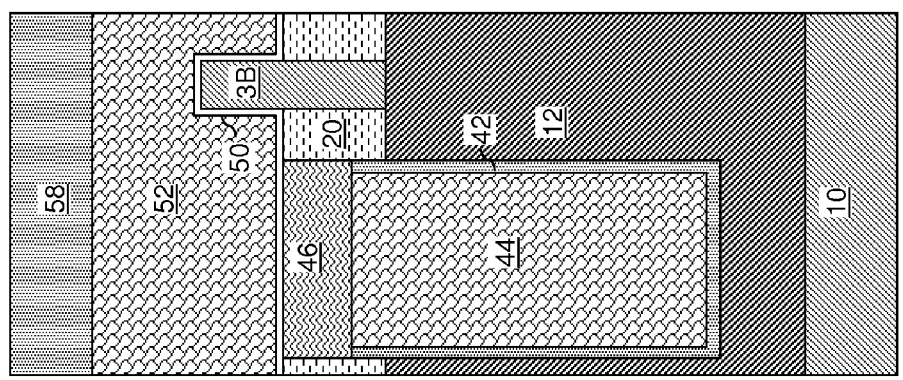
FIG. 12B is a vertical cross-sectional view of the first exemplary semiconductor structure along the vertical plane B-B' of FIG. 12A.
Figure 13A:
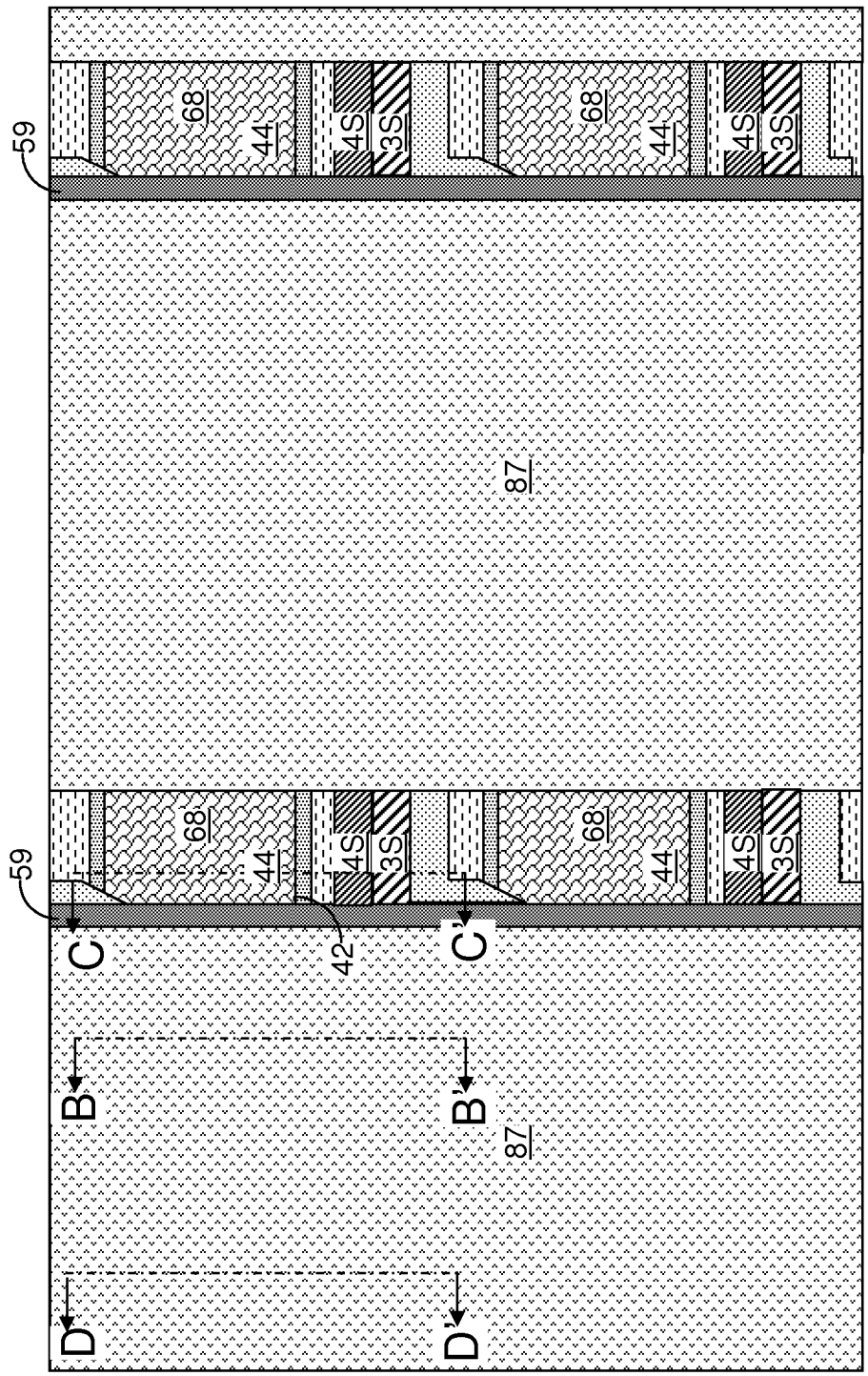
FIG. 13A is a top-down view of the first exemplary semiconductor structure after formation of line cavities and strap cavities according to the first embodiment of the present disclosure.
Figures 13C, 13D:
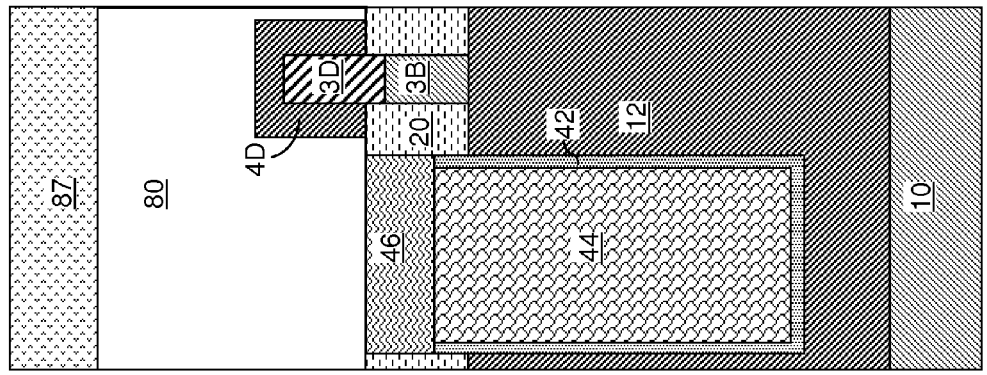
FIG. 13C is a vertical cross-sectional view of the first exemplary semiconductor structure along the vertical plane C-C' of FIG. 13A.
FIG. 13D is a vertical cross-sectional view of the first exemplary semiconductor structure along the vertical plane D-D' of FIG. 13A.
Figure 13B:
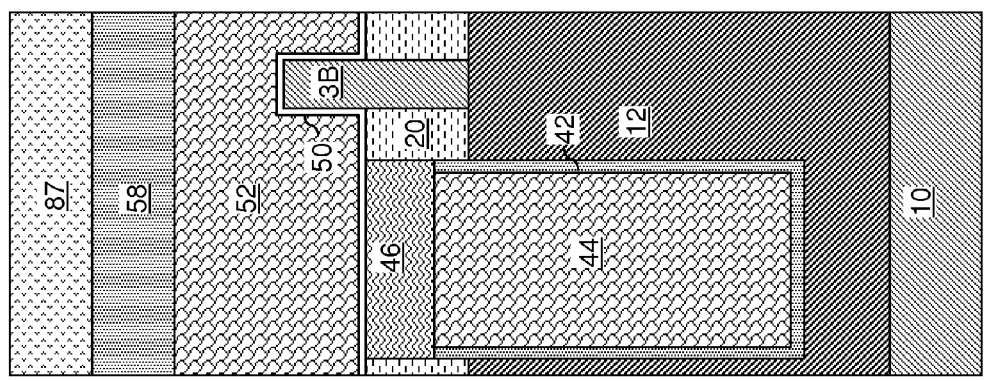
FIG. 13B is a vertical cross-sectional view of the first exemplary semiconductor structure along the vertical plane B-B' of FIG. 13A.
Figure 14A:
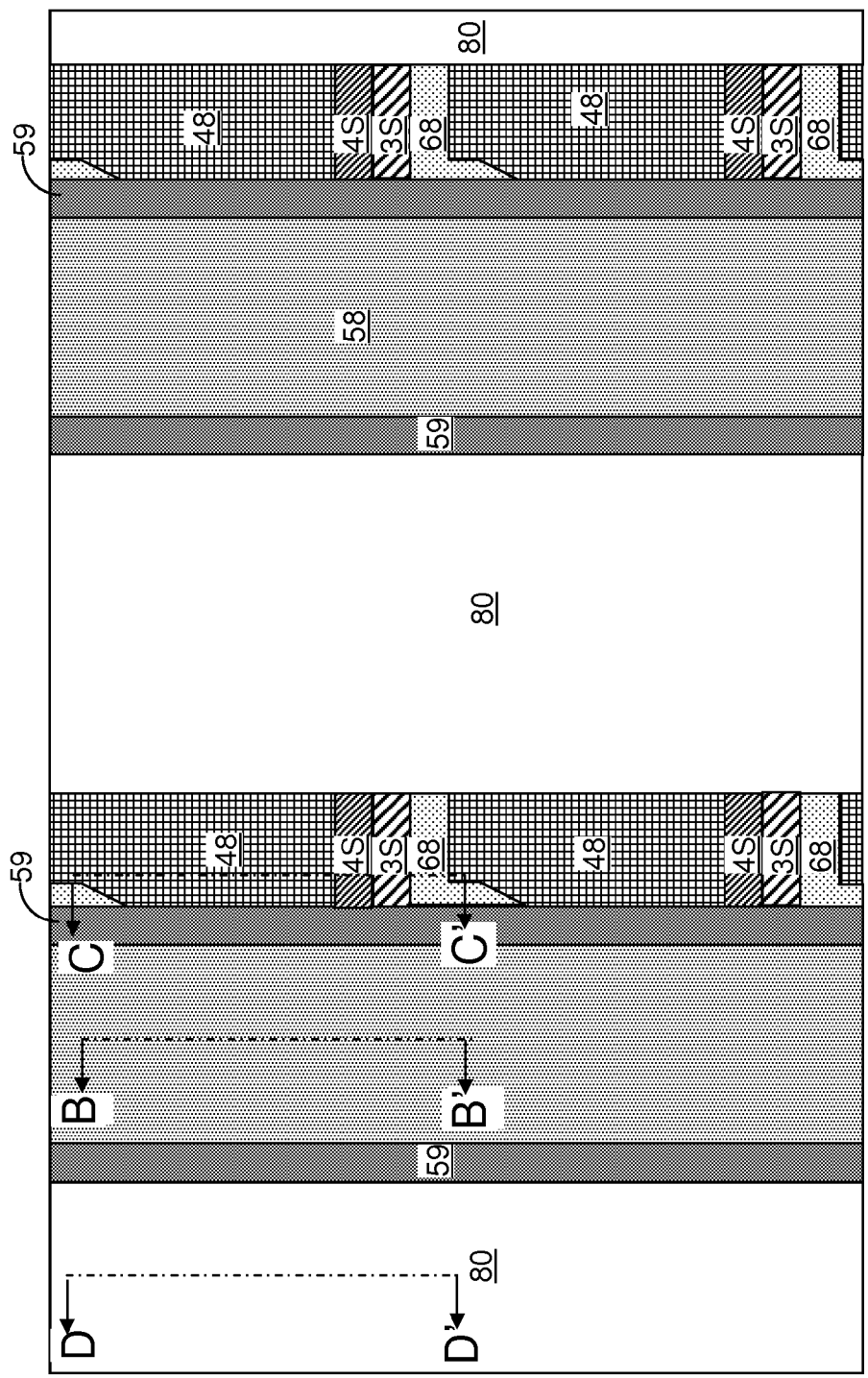
FIG. 14A is a top-down view of the first exemplary semiconductor structure after formation of conductive strap structures according to the first embodiment of the present disclosure.

Referring to FIGS. 8A-8C, a stack of gate level layers can be deposited and lithographically patterned to form gate structures (50, 52, 58). The gate level layers can include, for example, a gate dielectric layer, a gate material layer, and a gate cap layer. The gate dielectric layer can be a disposable dielectric material that is removed in field effect transistors to be formed, or can include a non-disposable dielectric material that remains permanently in field effect transistors to be formed. The gate material layer can include a disposable material that is removed in field effect transistors to be formed, or can include a non-disposable conductive material that remains permanently in field effect transistors to be formed. The gate cap layer includes a dielectric material such as silicon nitride or a dielectric nitride.

The gate dielectric layer can be formed by conversion of surface portions of a semiconductor material (e.g., the semiconductor material of the semiconductor fins 30; See FIGS. 7A and 7B), deposition of a dielectric material, or a combination thereof. The gate dielectric layer can include a dielectric semiconductor-containing compound (e.g., silicon oxide, silicon nitride, and/or silicon oxynitride) and/or a dielectric metal compound (e.g., dielectric metal oxide, dielectric metal nitride, and/or dielectric metal oxynitride).

If the gate fill layer includes a non-disposable conductive material, the gate material layer can include a doped semiconductor material and/or a metallic material. The gate fill layer can optionally include a work function metal layer that tunes the threshold voltage of the access transistor to be formed.

The gate level layers can be patterned by a combination of lithography and etch to form the gate structures (50, 52, 58). The gate structures (50, 52, 58) straddle the portions of the semiconductor fins 30 that become body regions of field effect transistors.

Each remaining portion of the gate dielectric layer within a gate structure (50, 52, 58) constitutes a gate dielectric 50. Each remaining portion of the gate fill layer within a gate structure (50, 52, 58) constitutes a gate fill structure 52. Each remaining portion of the gate cap layer within a gate structure (50, 52, 58) constitutes a gate cap dielectric 58.

Portions of the semiconductor fins 30 that underlie the gate structures (50, 52, 58) correspond to the body regions of access field effect transistors to be subsequently formed for the trench capacitors (12, 42, 44). The gate structures (50, 52, 58) can extend along the general direction of the widthwise direction of the plurality of semiconductor fins 30. While the present disclosure is described employing gate structures (50, 52, 58) extending along the direction perpendicular to the lengthwise direction of the semiconductor fins 30, embodiments in which wiggles are introduced within the gate structures (50, 52, 58) are expressly contemplated herein.

In one embodiment, the gate structures (50, 52, 58) are disposable gate structures that are subsequently replaced with other gate structures, which are herein referred to as replacement gate structures. In this case, the disposable gate structures include disposable materials, which are herein referred to as disposable gate materials, i.e., disposable materials formed within gate-level structures.

In one embodiment, the gate structures (50, 52, 58) are permanent gate structures that are present in field effect transistors and function as a combination of a gate dielectric and a gate electrode. In this case, the gate dielectric can include any gate dielectric material that can be employed in gate-first integration schemes, i.e., non-replacement gate integration schemes. Each gate fill structure 52 includes a conductive material and constitutes a gate electrode that is functional, i.e., capable of turning on or off field effect transistors.

Source regions 3S and drain regions 3D can be formed by implanting dopants of the opposite conductivity type of the first conductivity type. The gate structures (50, 52, 58) can be employed as mask structures during the ion implantation that forms the source regions 3S and the drain regions 3D. Unimplanted portions of the semiconductor fins 30 constitute body regions 3B.

Gate spacers 59 can be formed by depositing a conformal dielectric layer and anisotropically etching the conformal dielectric layer. In one embodiment, the conformal dielectric layer can include a dielectric material different from the dielectric material of the shallow trench isolation layer 20. For example, the conformal dielectric layer can include silicon nitride. The etch process that removes horizontal portions of the conformal dielectric layer can be prolonged after horizontal portions of the conformal dielectric layer are removed so that vertical portions of the conformal dielectric layer on sidewalls of the semiconductor fins (3S, 3D, 3B) are removed. Each remaining portion of the conformal dielectric layer around a gate structure (50, 52, 58) is a gate spacer 59. Each gate spacer 59 laterally surrounds a gate structure (50, 52, 58).

Optionally, dopants of the second conductivity type can be implanted into the source regions 3S and the drain regions 3D of the semiconductor fins (3S, 3D, 3B) employing the combination of the gate structures (50, 52, 58) and the gate spacers 59 as an implantation mask.

Referring to FIGS. 9A-9D, a patterned mask layer 67 is formed over the first exemplary semiconductor structure of FIGS. 8A-8C. In one embodiment, the patterned mask layer 67 can be a photoresist layer that is patterned by lithographic exposure and development. The patterned mask layer 67 covers the drain regions 3D of the semiconductor fins (3S, 3D, 3B), and physically exposes the source regions 3S of the semiconductor fins (3S, 3D, 3B). In one embodiment, the edges of the openings in the patterned mask layer 67 can be along the widthwise direction of the semiconductor fins (3S, 3D, 3B). In one embodiment, an edge of the patterned mask layer 67 can overlie a gate structure (50, 52, 58) or a gate spacer 59.

Referring to FIGS. 10A-10D, a dielectric material portion 68 is formed within a subset of the areas of the opening in the patterned mask layer 67 by an angled deposition method. In one embodiment, the angled deposition method can be angled gas cluster ion beam deposition of a dielectric material. In gas cluster ion beam deposition, a cluster of ions having a molecular weight in a range from 100 to 100,000 can be singly ionized, or ionized with a number of electrons that does not typically exceed 10. Such clusters of ions can travel at a low enough speed to prevent penetration through a surface of a material layer. Instead, the cluster of ions can be deposited on a surface.

The angle of incidence is selected to be at a non-normal angle with respect to the top surface of the insulator layer 20. The azimuthal angle of the tilt of the gas cluster ion beam can be selected such that the deposition of the dielectric material occurs only on one of a pair of parallel sidewalls of each source region 3S, and does not occur on the other of the pair of parallel sidewalls of each source region 3S. The sidewall of each source region 3S on which deposition of the dielectric material occurs is herein referred to as a first sidewall of the source region 3S, and the sidewall of each source region 3S on which deposition of the dielectric material does not occur is herein referred to as a second sidewall of the source region 3S.

The patterned mask layer 67 shades an area of the top surface of the insulator layer 20 within each opening in the patterned mask layer 20. Thus, each dielectric material portion 68 can have a straight edge at which the dielectric material portion 68 borders a physically exposed top surface of the insulator layer 20. In one embodiment, a dielectric material portion 68 can cover a portion of a top surface of the trench top dielectric portion 46. In one embodiment, a dielectric material portion 68 can contiguously extend from a first sidewall of a source region 3S to a portion of a trench top dielectric portion 68 located over a trench capacitor (12, 42, 44) located on the side of the second sidewall of a source region 3S. In one embodiment, a vertical portion of a dielectric material portion 68 can contact a sidewall of a gate spacer 59 and a trench top dielectric portion 46 overlying a trench capacitor located on the side of the first sidewall of the source region 3S.

Further, each source region 3S shades another portion of the top surface of the insulator layer 20 and a portion of each trench top dielectric portion 46. In one embodiment, the shape of each shaded portion of a top surface of a trench top dielectric portion 46 can be triangular. The direction of the clusters of ions during the gas cluster ion beam deposition is shown with arrows marked as "GCIB." In one embodiment, a source region 3S can shade a portion of a sidewall of a gate spacer 59 from gas cluster ions during the angled gas cluster ion beam deposition.

In one embodiment, the deposited dielectric material can be silicon nitride. The thickness of each dielectric material portion 68, as measured at the first sidewall of each source region 3S, can be in a range from 3 nm to 30 nm, although lesser and greater thicknesses can also be employed. The dielectric material portions 68 are formed on the end walls of the source regions 3S. As used herein, end walls of a source region refers to the widthwise sidewall of the source region. Each dielectric material portion 68 contacts a first sidewall of a source region 3S, and a second sidewall of the source region 3S is physically exposed after formation of the dielectric material portions 68.

Referring to FIGS. 11A-11D, the patterned mask layer 67 is removed, for example, by ashing. A selective epitaxy process can be performed to deposit a semiconductor material on physically exposed semiconductor surfaces, i.e., the second sidewall of each source region 3S and physically exposed surfaces of the drain regions 3D. A raised source region 4S can be formed directly on each second sidewall of the source regions 3S, and a raised drain region 4D can be formed directly on each drain region 3D. Each raised source region 4S is epitaxially aligned to an underlying source region 3S. Each raised drain region 4D is epitaxially aligned to an underlying drain region 3D. The lateral extent of the raised source regions 4S and the raised drain regions 4D is controlled to avoid electrical shorts thereamongst. The outer sidewalls surfaces of the raised source regions 4S and the raised drain regions 4D may, or may not, contact top surfaces of the trench top dielectric portions 46, depending on the thickness of the raised source regions 4S and the raised drain region 4D.

Formation of the raised drain regions 4D on sidewalls of the drain regions 3D and formation of the raised source regions 4S on the second sidewalls of the source regions 3S occur simultaneously. Thus, the raised drain regions 4D formed on sidewalls of the drain regions 3D and the raised source regions 4S formed on the second sidewalls of the source regions 3S can have the same material composition.

Referring to FIGS. 12A-12D, a planarization dielectric layer 80 is formed over the plurality of semiconductor fins (3S, 3D, 3B) and the gate structures (50, 52, 58). The planarization dielectric layer 80 can be formed, for example, by spin-on coating or chemical vapor deposition (CVD) of a dielectric material. The planarization dielectric layer 80 may include a single dielectric material layer, or may include a plurality of dielectric material layers. Excess portions of the deposited dielectric material layer can be removed from above the horizontal plane including the top surfaces of the gate cap dielectrics 58, for example, by chemical mechanical planarization.

Optionally, the gate structures (50, 52, 58) may be replaced with replacement gate structures employing methods known in the art. In this case, the removal of the gate structures (50, 52) can be performed employing at least one etch that is selective to the dielectric material of the planarization dielectric layer 80. Formation of the replacement gate structures can be formed by depositing a gate dielectric layer and a conductive material layer, and removing excess portions of the gate dielectric layer and the conductive material layer from above the top surface of the planarization dielectric layer 80, for example, by chemical mechanical planarization (CMP).

Referring to FIGS. 13A-13D, a photoresist layer 87 is applied over the first exemplary semiconductor structure of FIGS. 12A-12D, and is lithographically patterned to form openings overlying each contiguous area including a raised source region 4S and a neighboring deep trench capacitor (12, 42, 44). In one embodiment, the photoresist layer 87 can cover the drain regions 3D of the semiconductor fins (3S, 3D, 3B), and physically expose each area of the first exemplary semiconductor structure that includes at least portions of the raised source regions 4S that are proximal to an outer sidewall of a gate spacer 59. In one embodiment, an edge of an opening in the photoresist layer 87 can be along the widthwise direction of the semiconductor fins (3S, 3D, 3B). In one embodiment, an edge of an opening in the photoresist layer 87 can overlie a gate structure (50, 52, 58) or a gate spacer 59, and another edge of the photoresist layer 87 can overlie a vertical portion of a dielectric material portion 87. In one embodiment, an opening in the photoresist layer can have a rectangular horizontal cross-sectional shape such that one side of the rectangular horizontal cross-sectional shape overlies a gate structure (50, 52, 58) or a gate spacer 59, and another side of the rectangular horizontal cross-sectional shape can overlie at least one raised source region 4S and/or a vertical portion of a dielectric material portion 87.

The dielectric materials of the planarization dielectric layer 80, the trench top dielectric portions 46, and the shallow trench isolation layer 20 can be recessed within the areas of the openings within the photoresist layer 87 by an anisotropic etc. In one embodiment, the anisotropic etch can include a first etch step that etches the dielectric material of the planarization dielectric layer 80 selective to the semiconductor material of the raised source regions 4S and the dielectric material of the dielectric material portions 68. The first etch step can etch the dielectric material of the planarization dielectric layer 80, and can stop at the top surfaces of the dielectric material portions 68, which are present above the trench top dielectric portions 46 and above the source regions 3S. A line cavity 49 and an upper portion of each strap cavity 47 underlying the line cavity 49 are formed by the first etch step within each opening in the photoresist layer 87. In one embodiment, each line cavity 49 can have the same width throughout. The height of the bottom of each line cavity 49 is located within a horizontal plane including top surfaces of the raised source regions 4S.

The anisotropic etch can further include a second etch step that etches the horizontal portions of the dielectric material portions 68 to physically expose the underlying top surfaces of the trench top dielectric portions 46 ad the underlying top surfaces of the source regions 3S. The second etch step can be selective to the semiconductor material of the raised source regions 4S. The second etch step can end when the underlying top surfaces of the trench top dielectric portions 46 ad the underlying top surfaces of the source regions 3S are physically exposed. A vertical portion of a dielectric material portion 68 remains on each first sidewall of a source region 3S after the second etch step. Each strap cavity 49 is vertically extended by the thickness of horizontal portions of the dielectric material portion 68 over the trench top dielectric portions 46.

In one embodiment, a dielectric material portions 68 can contiguously extend over a portion of a trench top dielectric portion 68 overlying a trench capacitor (12, 42, 44), and can contact another trench top dielectric portion 48 overlying another trench capacitor (12, 42, 44). A horizontal portion of a dielectric material portion 68 can be removed from above a trench top dielectric portion 46 within each area of the strap cavities 47 during the second etch step of the anisotropic etch.

The anisotropic etch can further include a third etch step that etches the dielectric materials of the trench top dielectric portions 46 and the shallow trench isolation layer 20 selective to the semiconductor materials of the raised source regions 4S and the source regions 3S and the dielectric material of the dielectric material portion 68. Thus, at the third etch step, the anisotropic etch employs the combination of the photoresist layer 87, the dielectric material portions 68, the source regions 3S, and the raised source regions 4S as an etch mask layer. Each strap cavity 47 can extend to the top surface of an underlying inner electrode 44 at the end of the third step of the anisotropic etch. In one embodiment, the strap cavity can have a rectangular horizontal cross-sectional shape below the height of the top surfaces of the source regions 3S and the remaining portions of the dielectric material portions 68 and above the top surfaces of the inner electrodes 44. Each combination of a line cavity 49 and underlying strap cavities 47 forms an integrated cavity that extends contiguously over a plurality of source regions 3S. Thus, in the third etch step of the anisotropic etch, the trench top dielectric portions 46 are vertically recessed to physically expose top surfaces of inner electrodes 44 of the trench capacitors (12, 42, 44) within each area of the strap cavities 47.

In one embodiment, the shallow trench isolation layer 20, the trench top dielectric portions 46, and the planarization layer 80 can include doped or undoped silicon oxide or organosilicate glass, and the dielectric material portions 68 can include silicon nitride, and the source regions 3S and the raised source regions 4S can include doped silicon or doped silicon-containing alloys. In this case, the etch chemistry for the various steps of the anisotropic etch can be selected to provide suitable selectivity employing etch chemistries for reactive ion etch as known in the art.

Referring to FIGS. 14A-14D, a conductive material is deposited within the strap cavities 47 (See FIG. 13C) and the line cavities 49, and is vertically recessed to form conductive strap structures 48. Specifically, the conductive material is deposited to fill the strap cavities 47 and the line cavities by physical vapor deposition (PVD), chemical vapor deposition (CVD), atomic layer deposition (ALD), or other deposition methods for depositing a conductive material as known in the art. Excess portions of the conductive material are removed from above the top surfaces of the planarization dielectric layer 80, for example, by chemical mechanical planarization (CMP), a recess etch, or a combination thereof. Subsequently, the portions of the conductive material filling the line cavities 49 are removed by a recess etch that removes the conductive material selective to the dielectric material of the planarization dielectric layer 80. The conductive material can be further recessed until the top surfaces of the dielectric material portions 68 are physically exposed, and the remaining conductive material underneath each line cavity 49 are divided into a plurality of disjoined conductive material portions that are laterally spaced from each other by combinations of a dielectric material portion 68, a source region 3S, and a raised source region 4S.

In one embodiment, the conductive material can be a doped semiconductor material such as doped silicon or a doped silicon-containing semiconductor alloy. In this case, an upper portion of each raised source region 4S can be vertically recessed during the vertical recessing of the conductive material, and the top surfaces of the dielectric material portions 68 can be substantially coplanar with top surfaces of source regions 3S, and raised source regions 4S, and conductive strap structures 48. In another embodiment, the conductive material can include a metal, an intermetallic alloy, or a metallic compound including nitrogen and/or carbon.

Figure 15A:
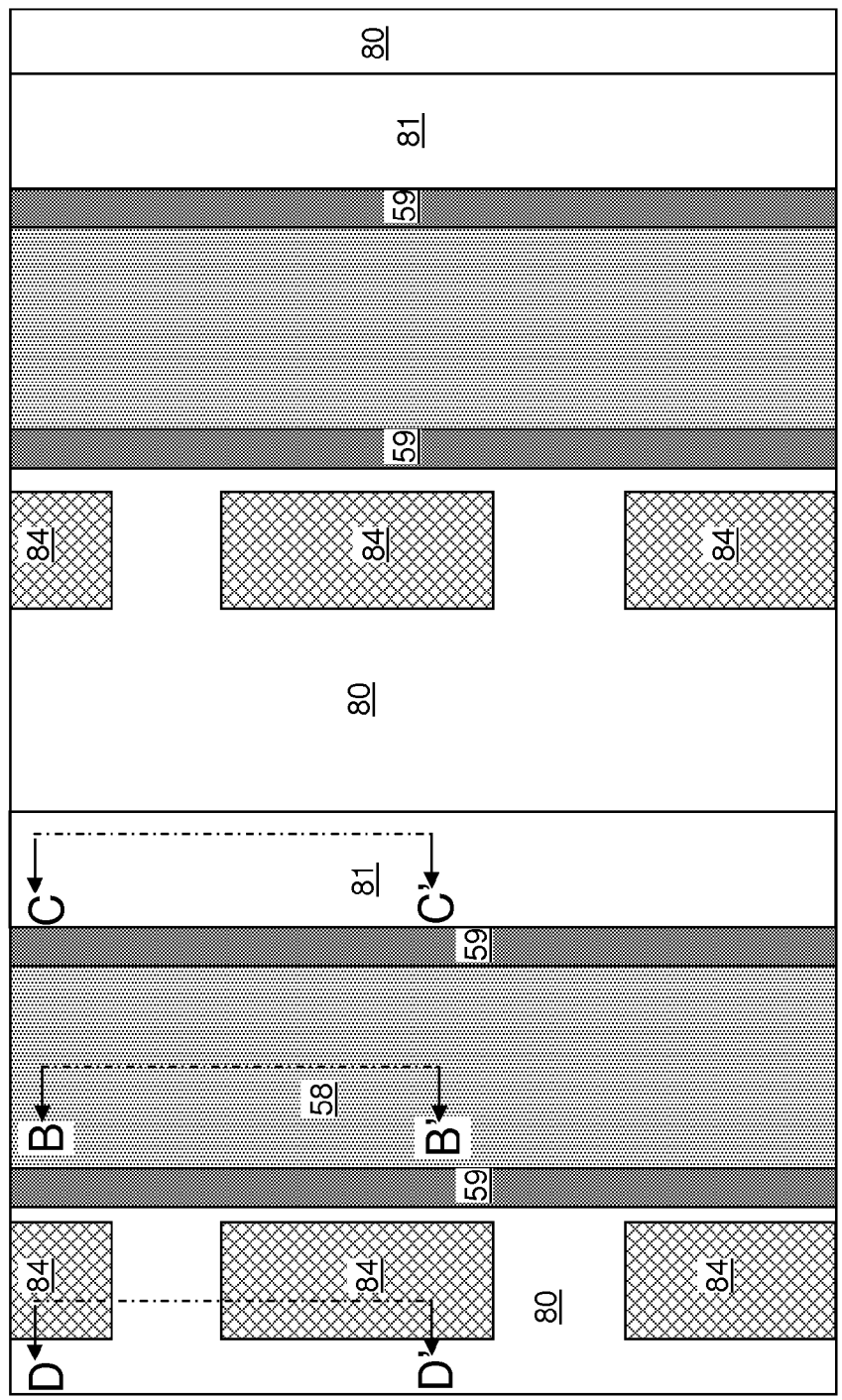
FIG. 15A is a top-down view of the first exemplary semiconductor structure after formation of line cavity fill dielectric portions and drain contact via structures according to the first embodiment of the present disclosure.
Figure 15D:
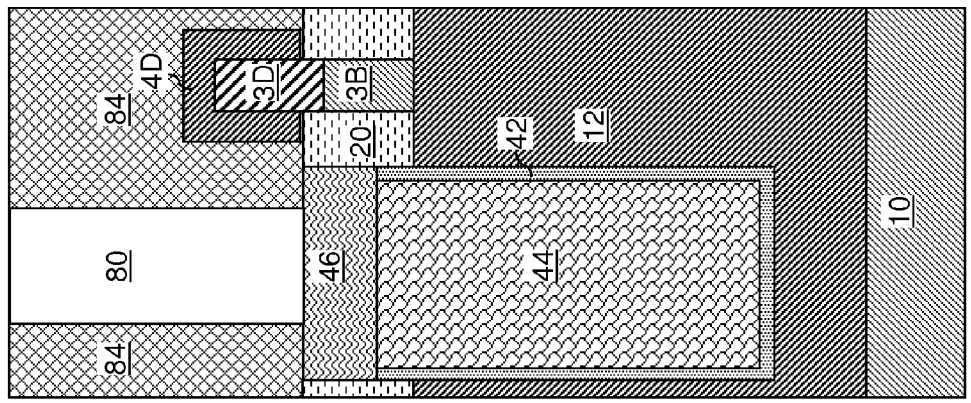
FIG. 15D is a vertical cross-sectional view of the variation of the first exemplary semiconductor structure along the vertical plane D-D' of FIG. 15A.
Figure 15C:
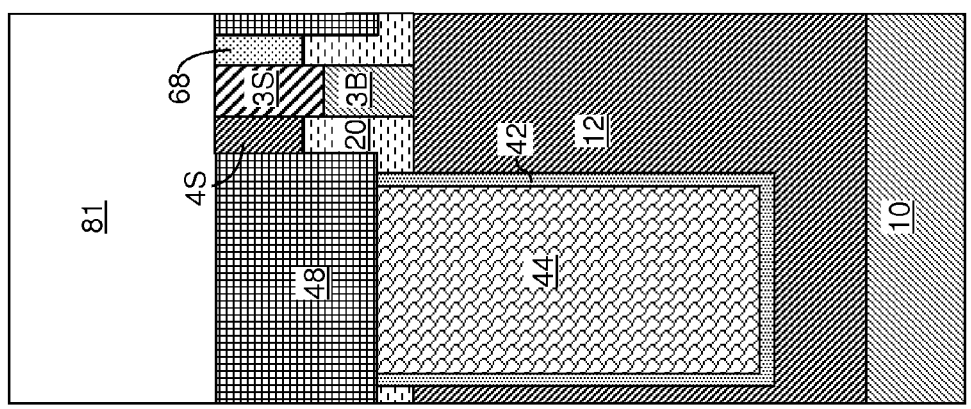
FIG. 15C is a vertical cross-sectional view of the variation of the first exemplary semiconductor structure along the vertical plane C-C' of FIG. 15A.
Figure 15B:
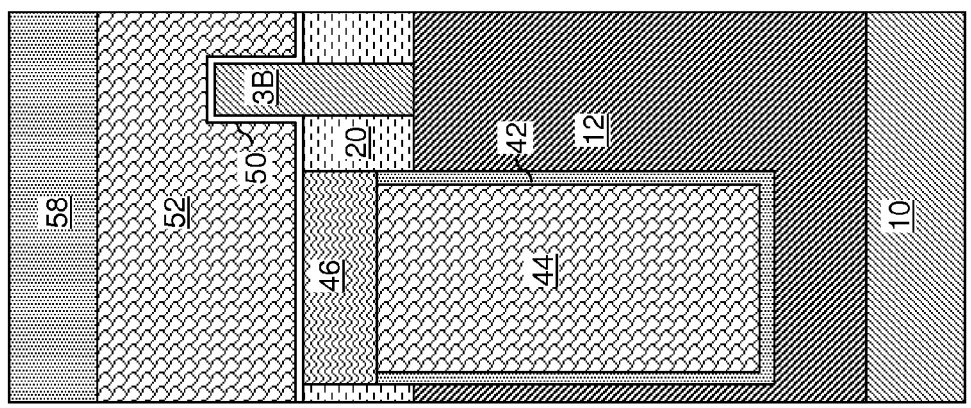
FIG. 15B is a vertical cross-sectional view of the variation of the first exemplary semiconductor structure along the vertical plane B-B' of FIG. 15A.
Figure 16A:
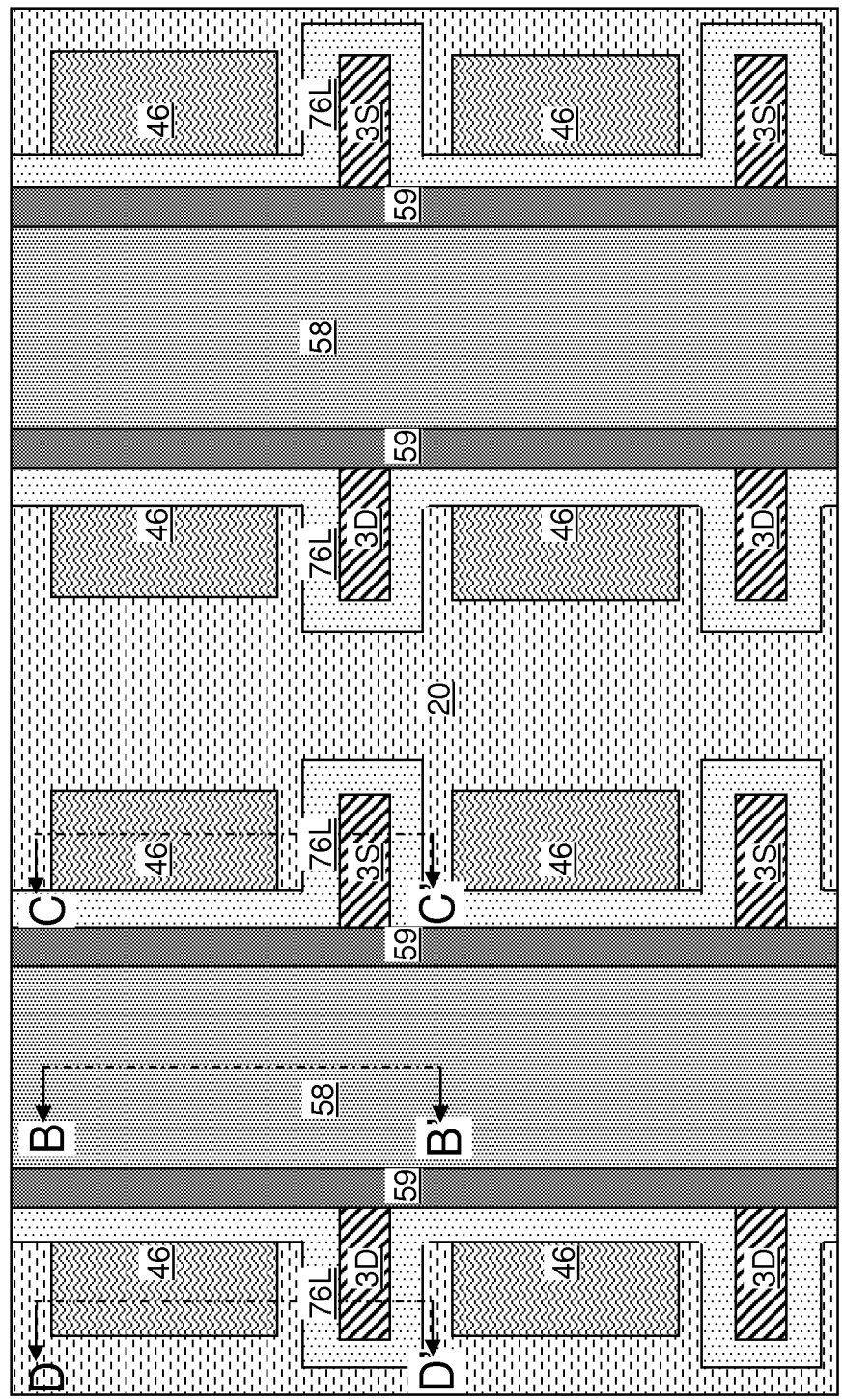
FIG. 16A is a top-down view of a second exemplary semiconductor structure after formation of a dielectric spacer according to a second embodiment of the present disclosure.
Figure 17A:
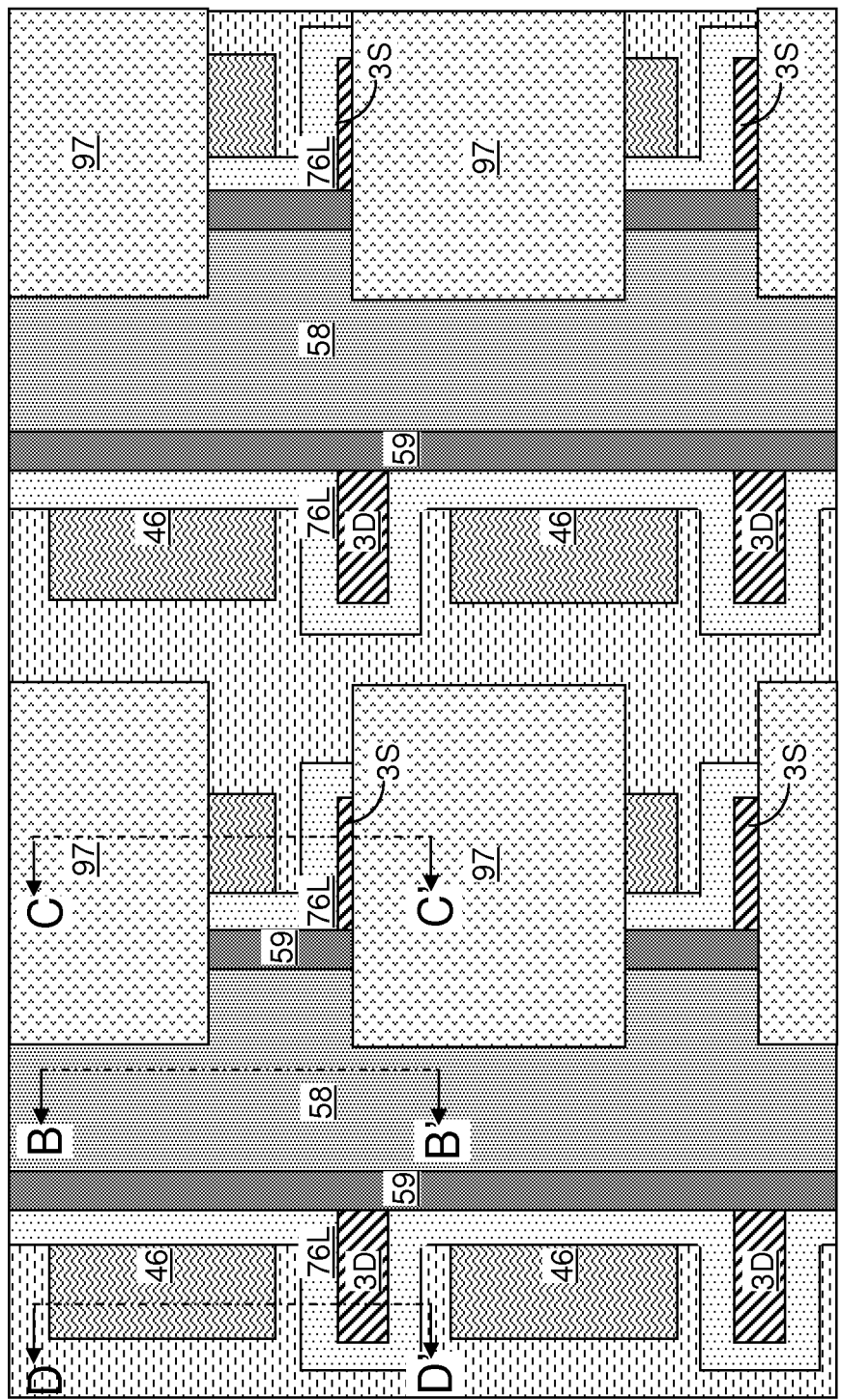
FIG. 17A is a top-down view of the second exemplary semiconductor structure during an ion implantation that introduces structural damages to unmasked portions of the dielectric spacer according to the second embodiment of the present disclosure.
Figure 18A:
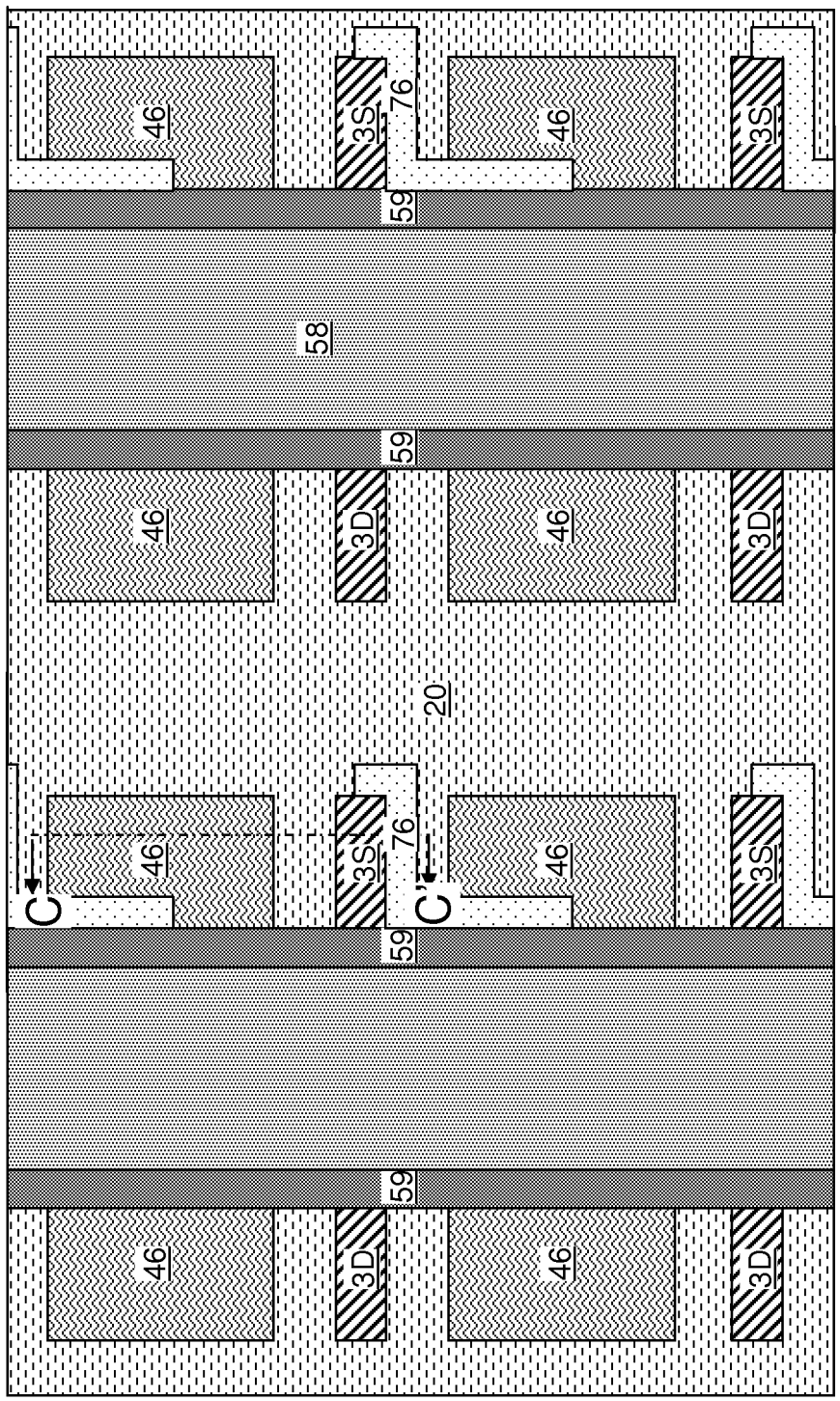
FIG. 18A is a top-down view of the second exemplary semiconductor structure after removal of physically damaged portions of the dielectric spacer according to the second embodiment of the present disclosure.
Figure 18B:
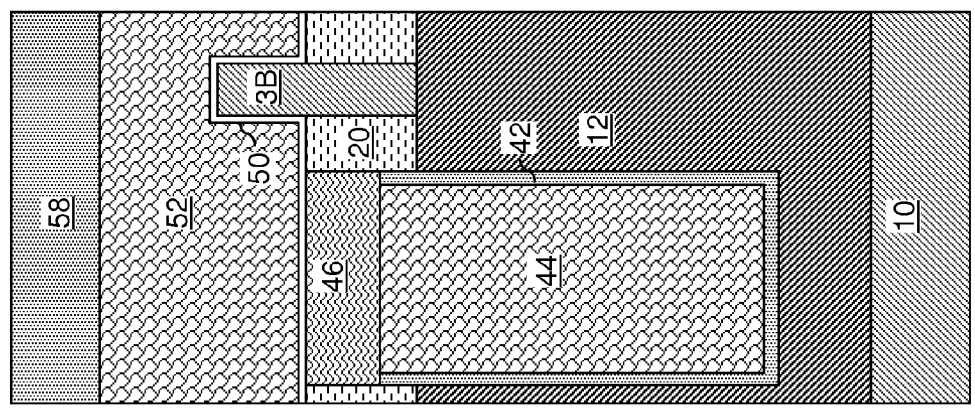
FIG. 18B is a vertical cross-sectional view of the variation of the second exemplary semiconductor structure along the vertical plane B-B' of FIG. 18A.
Figure 18C:
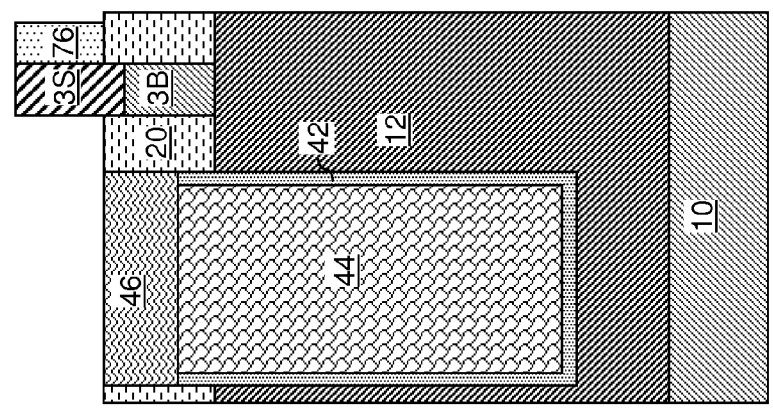
FIG. 18C is a vertical cross-sectional view of the variation of the second exemplary semiconductor structure along the vertical plane C-C' of FIG. 18A.
Figure 18D:
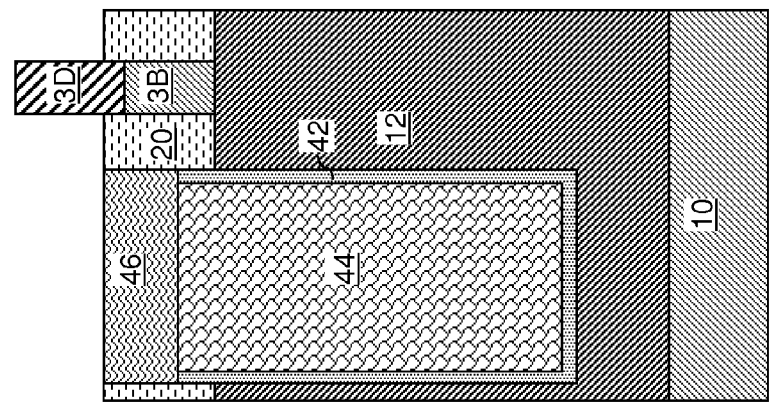
FIG. 18D is a vertical cross-sectional view of the variation of the second exemplary semiconductor structure along the vertical plane D-D' of FIG. 18A.
Figure 19A:
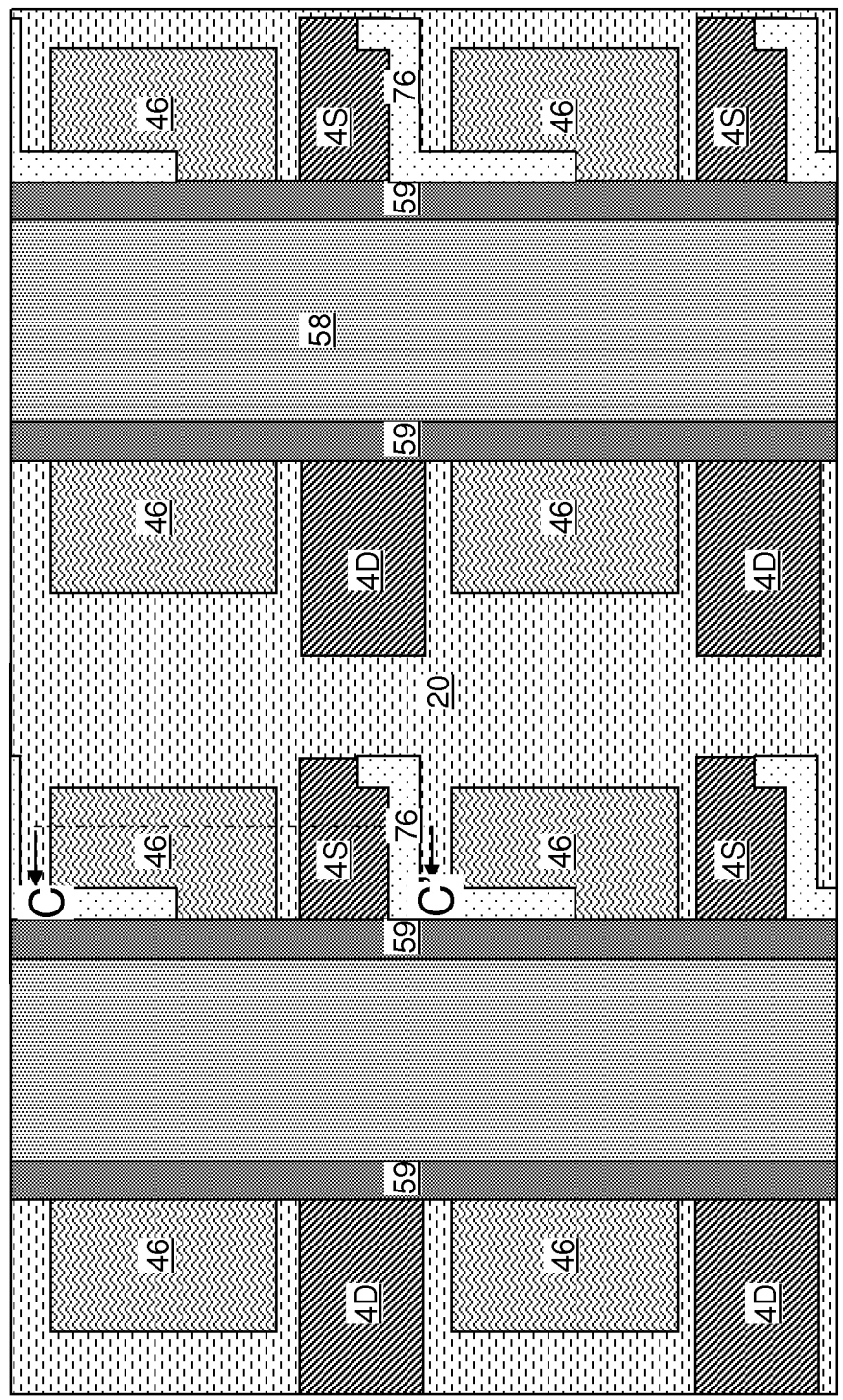
FIG. 19A is a top-down view of the second exemplary semiconductor structure after formation of raised active regions according to the second embodiment of the present disclosure.
Figure 19D:
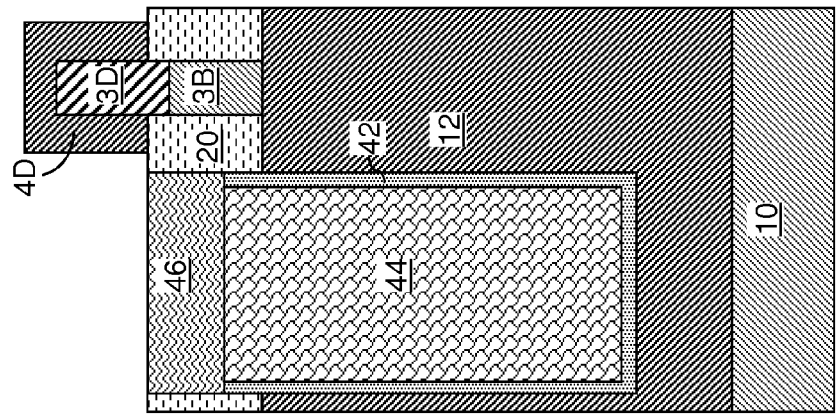
FIG. 19D is a vertical cross-sectional view of the variation of the second exemplary semiconductor structure along the vertical plane D-D' of FIG. 19A.
Figure 19C:
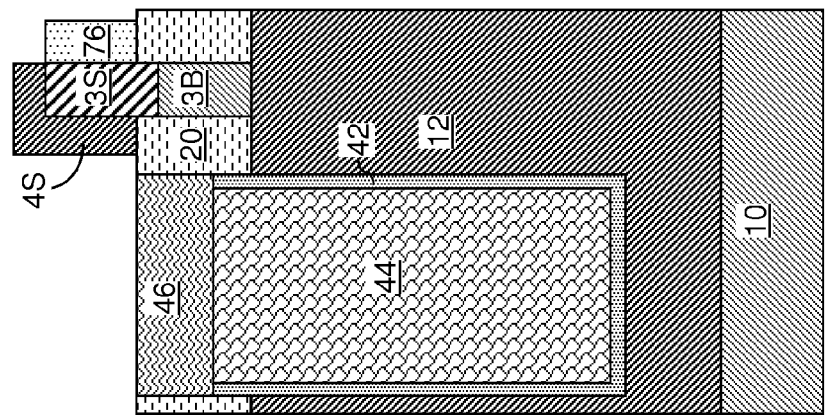
FIG. 19C is a vertical cross-sectional view of the variation of the second exemplary semiconductor structure along the vertical plane C-C' of FIG. 19A.
Figure 19B:
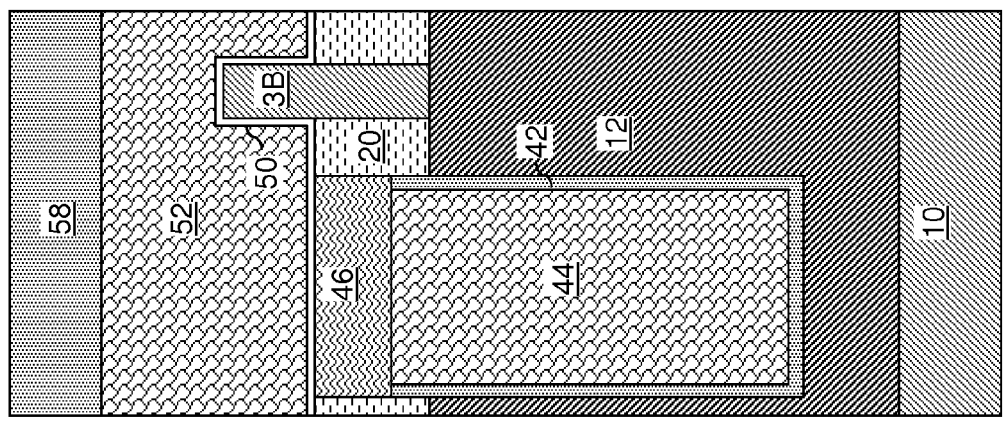
FIG. 19B is a vertical cross-sectional view of the variation of the second exemplary semiconductor structure along the vertical plane B-B' of FIG. 19A.
Figure 20A:
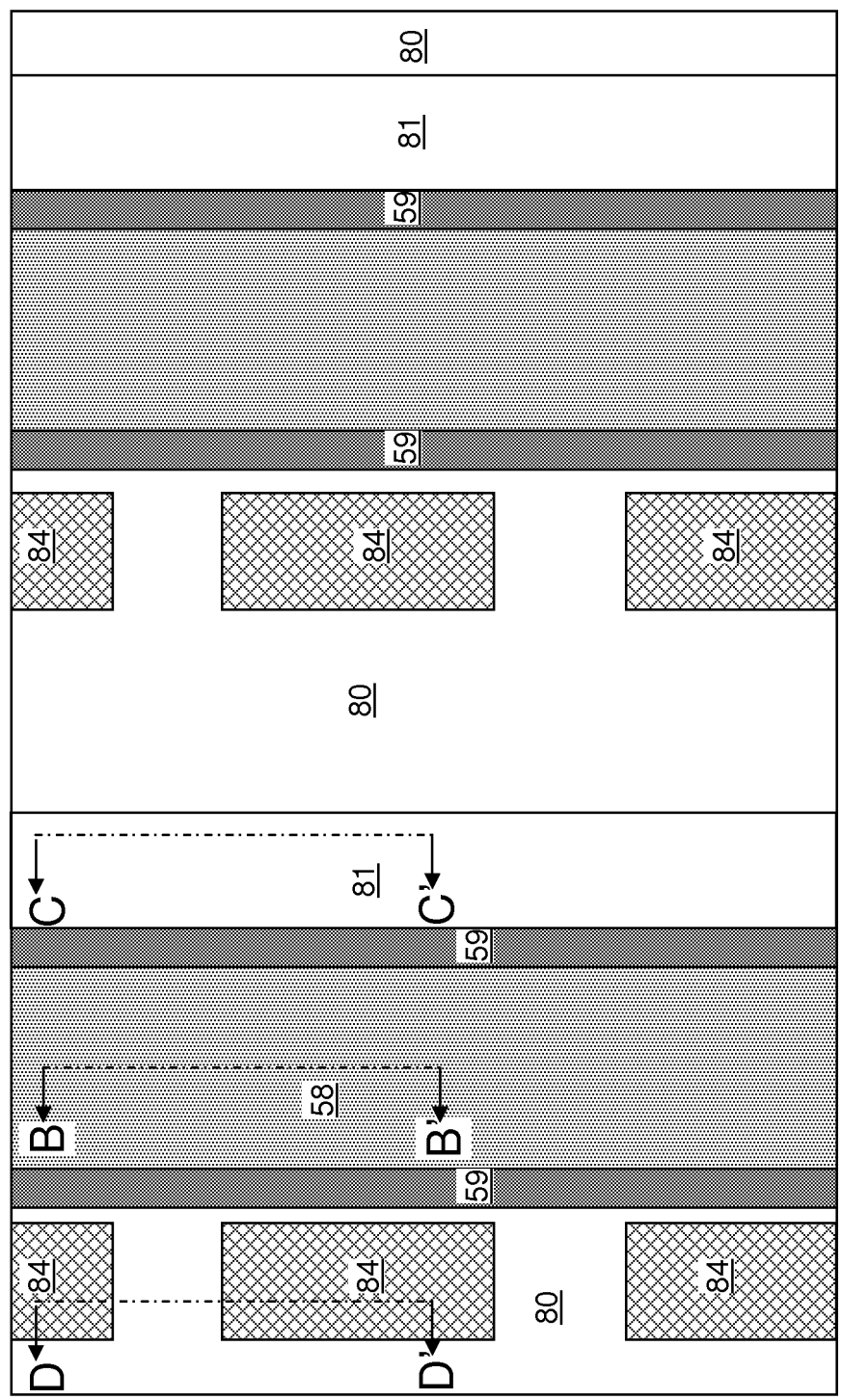
FIG. 20A is a top-down view of the second exemplary semiconductor structure after formation of a planarization dielectric layer and various contact via structures according to the second embodiment of the present disclosure.
Figure 20D:
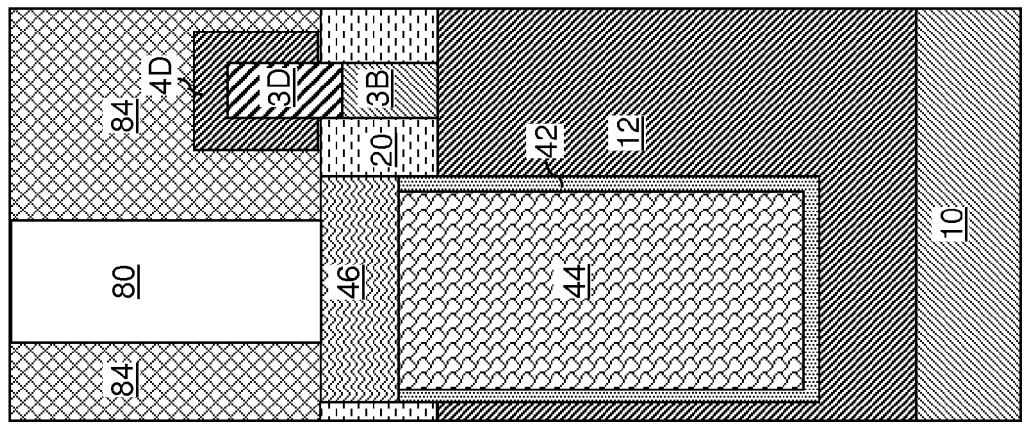
FIG. 20D is a vertical cross-sectional view of the second exemplary semiconductor structure along the vertical plane D-D' of FIG. 20A.
Figure 20C:
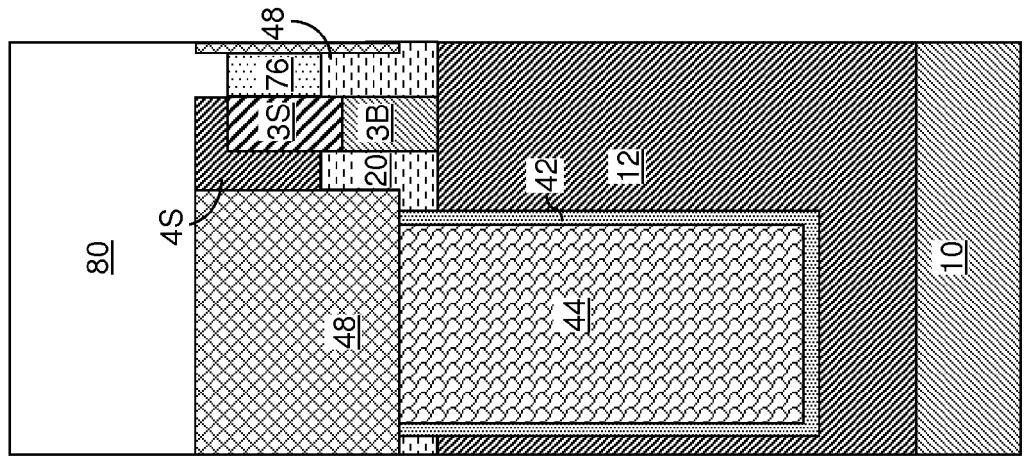
FIG. 20C is a vertical cross-sectional view of the second exemplary semiconductor structure along the vertical plane C-C' of FIG. 20A.
Figure 20B:
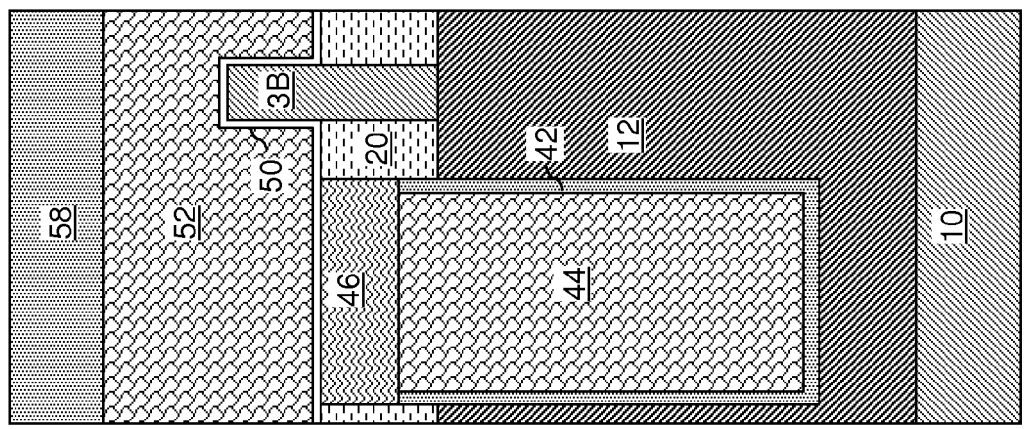
FIG. 20B is a vertical cross-sectional view of the second exemplary semiconductor structure along the vertical plane B-B' of FIG. 20A.

Referring to FIGS. 15A-15C, each line cavity 49 (See FIG. 14C) is filled with a dielectric material to form a dielectric fill material portion 81. The dielectric fill material portions 81 can include a spin-on-glass (SOG) material, a doped or undoped silicon oxide, silicon nitride, a porous or non-porous organosilicate glass, or a combination thereof. The dielectric material of the dielectric fill material portions 81 can be deposited, for example, by spin-on coating or chemical vapor deposition. Excess portions of the deposited dielectric material can be removed from above the top surface of the planarization dielectric layer 80, for example, by chemical mechanical planarization (CMP). In one embodiment, the line cavities 49 can have a uniform width throughout, and the dielectric fill material portions 81 can be line cavity fill dielectric portions, i.e., dielectric material portions that fill line cavities.

Via cavities can be formed over each drain region 3D, and can be filled with a conductive material by chemical vapor deposition or physical vapor deposition. Excess portions of the conductive material can be removed from above the top surface of the planarization dielectric layer 80, for example, by chemical mechanical planarization. Drain contact via structures 84 are formed within the planarization dielectric layer 80. Each drain contact via structure 84 can be in physical contact with a top surface of a raised drain region 4D.

Referring to FIGS. 16A-16D, a second exemplary semiconductor structure according to a second embodiment of the present disclosure can be derived from the first exemplary semiconductor structure of FIGS. 8A-8C by formation of a dielectric spacer 76L on the sidewalls of the semiconductor fins (3S, 3D, 3B) and the outer sidewalls of the gate spacers 59. The dielectric spacers 76L can be formed by conformal deposition of a dielectric material layer and a subsequent anisotropic etch that removes horizontal portions of the deposited dielectric material layer. The dielectric spacers 76L can include, for example, silicon nitride. The thickness of the dielectric spacers 76L can be in a range from 3 nm to 30 nm, although lesser and greater thicknesses can also be employed. The dielectric spacers 76L cover the sidewalls of the source regions 3S and the drain regions. In one embodiment, top surfaces of the source regions 3S and the drain regions 3D can be the only physically exposed surfaces of the source regions 3S and the drain regions 3D.

Referring to FIGS. 17A-17D, a patterned mask layer 97 is formed over the second exemplary semiconductor structure of FIGS. 16A-16D. The patterned mask layer 97 covers each interface between a first sidewall of a source region 3S and a dielectric spacer 76L, while physically exposing each interface between a second sidewall of a source region 3S and a dielectric spacer 76L and interfaces between the drain regions 3D and the dielectric spacers 76L. Thus, a portion of each dielectric spacer 76L contacting the first sidewall of a source region 3S can be masked with the patterned mask layer 97. In one embodiment, the patterned mask layer 97 can be a lithographically patterned photoresist layer.

Structural damage is induced within the unmasked portions of the dielectric spacers 76L by ion implantation. The ion implantation can be performed at various angles so that vertical portions and the horizontal portions of the dielectric spacers 76L are damaged by the ion implantation within all areas in which the patterned mask layer 97 is not present. The implanted species of ions can include germanium, silicon, oxygen, and/or any other species that can cause structural damages to the implanted portions of the dielectric spacers 76L. The energy of the ion implantation process can be selected that the energy of the ions can reach the bottommost portions or innermost portions of the unmasked portions of the dielectric spacers 76L. In one embodiment, the dielectric spacers 76L include nitrogen, and the implanted ions can include germanium or oxygen.

Referring to FIGS. 18A-18D, the structurally damaged portions of the dielectric spacers 76L are removed by an etch process that removes the structurally damaged portions of the dielectric spacers 76L faster than undamaged portions of the dielectric spacers 76L. In one embodiment, the etch rate of the structurally damaged portions of the dielectric spacers 76L can be at least twice the etch rate of undamaged portions of the dielectric spacers 76L. Each remaining portion of the dielectric spacers 76L is a dielectric material portion 76. Each dielectric material portion contacts a first sidewall of a source region 3S, and a second sidewall of the source region 3S that is parallel to the first sidewall of the source region 3S is physically exposed after formation of the dielectric material portions 76. The patterned mask layer 97 can be removed prior to, or after, the etch process that removes the structurally damaged portions of the dielectric spacers 76L.

Referring to FIGS. 19A-19D, the processing steps of FIGS. 11A-11D are performed to form raised source regions 4S and raised drain regions 4D. A selective epitaxy process can be performed to deposit a semiconductor material on physically exposed semiconductor surfaces, i.e., the second sidewall of each source region 3S and physically exposed surfaces of the drain regions 3D. A raised source region 4S can be formed directly on each second sidewall of the source regions 3S, and a raised drain region 4D can be formed directly on each drain region 3D. Each raised source region 4S is epitaxially aligned to an underlying source region 3S. Each raised drain region 4D is epitaxially aligned to an underlying drain region 3D. The lateral extent of the raised source regions 4S and the raised drain regions 4D is controlled to avoid electrical shorts thereamongst. The outer sidewalls surfaces of the raised source regions 4S and the raised drain regions 4D may, or may not, contact top surfaces of the trench top dielectric portions 46, depending on the thickness of the raised source regions 4S and the raised drain region 4D.

Formation of the raised drain regions 4D on sidewalls of the drain regions 3D and formation of the raised source regions 4S on the second sidewalls of the source regions 3S occur simultaneously. Thus, the raised drain regions 4D formed on sidewalls of the drain regions 3D and the raised source regions 4S formed on the second sidewalls of the source regions 3S can have the same material composition.

Referring to FIGS. 20A-20D, the processing steps of FIGS. 12A-12D, 13A-13D, 14A-14D, and 15A-15D are sequentially performed to form the second exemplary semiconductor structure.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
   a semiconductor fin located on a substrate and including a source region;
   a dielectric material portion contacting a first sidewall of said source region;
   a raised source region contacting a second sidewall of said source region, wherein a bottommost surface of said raised source region is coplanar with a bottommost surface of said dielectric material portion;
   a trench capacitor located within said substrate, wherein said trench capacitor includes a buried plate surrounding a trench containing a node dielectric and an inner electrode, and wherein a bottommost surface of semiconductor fin is in direct physically contact with an uppermost surface of said buried plate; and
   a conductive strap structure contacting said inner electrode of said trench capacitor and said raised source region.

2. The semiconductor structure of claim 1, further comprising:
   a drain region located within said semiconductor fin; and
   a raised drain region located on sidewalls of said drain region and comprising a same semiconductor material as said raised source region.

3. The semiconductor structure of claim 1, wherein a sidewall of said raised source region is vertically coincident with a sidewall of said conductive strap structure.

4. The semiconductor structure of claim 1, further comprising a shallow trench isolation layer laterally surrounding said semiconductor fin, wherein a sidewall of said shallow trench isolation structure is vertically coincident with a sidewall of said conductive strap structure.

5. The semiconductor structure of claim 1, further comprising a trench top dielectric portion overlying said trench capacitor and contacting a sidewall of said conductive strap structure.

6. The semiconductor structure of claim 5, wherein said dielectric material portion contiguously extends over a portion of said trench top dielectric portion.

7. The semiconductor structure of claim 1, wherein said conductive strap structure has a top surface that is coplanar with a top surface of said raised source region.

8. The semiconductor structure of claim 1, wherein said dielectric material portion contacts a trench top dielectric portion overlying another trench capacitor.

9. The semiconductor structure of claim 1, wherein a sidewall of said dielectric material portion is in physical contact with another conductive strap structure that contacts an inner electrode of another trench capacitor.

10. The semiconductor structure of claim 1, wherein said dielectric material portion is in contact with a sidewall of a gate spacer and does not contact a trench top dielectric portion overlying said trench capacitor.

11. The semiconductor structure of claim 1, wherein a topmost surface of each of said raised source region, said source region, said conductive strap structure, and said dielectric material portion are coplanar with each other.

12. The semiconductor structure of claim 1, wherein said source region is located on a topmost surface of body portion of said semiconductor fin, wherein said body portion and said source region have outermost sidewalls that are vertically aligned to each other.

13. A semiconductor structure comprising:
   a semiconductor fin located on a substrate and including a source region;
   a dielectric material portion contacting a first sidewall of said source region;
   a raised source region contacting a second sidewall of said source region, wherein a bottommost surface of said raised source region is coplanar with a bottommost surface of said dielectric material portion and wherein a topmost surface of said raised source region is coplanar with a topmost surface of said conductive strap structure, and said topmost surface of both said raised source region and said conductive strap is located above a topmost surface source region;
   a trench capacitor located within said substrate, wherein said trench capacitor includes a buried plate surrounding a trench containing a node dielectric and an inner electrode, and wherein a bottommost surface of semiconductor fin is in direct physically contact with an uppermost surface of said buried plate; and
   a conductive strap structure contacting said inner electrode of said trench capacitor and said raised source region.

\* \* \* \* \*